United States Patent
Lee

(10) Patent No.: US 8,791,510 B2
(45) Date of Patent: Jul. 29, 2014

(54) SEMICONDUCTOR DEVICE INCLUDING CONTACT STRUCTURE, METHOD OF FABRICATING THE SAME, AND ELECTRONIC SYSTEM INCLUDING THE SAME

(75) Inventor: Young-Kyu Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/488,634

(22) Filed: Jun. 5, 2012

(65) Prior Publication Data

US 2012/0313151 A1 Dec. 13, 2012

(30) Foreign Application Priority Data

Jun. 7, 2011 (KR) .................. 10-2011-0054704

(51) Int. Cl.
 *H01L 21/336* (2006.01)
(52) U.S. Cl.
 USPC ........... 257/288; 257/134; 257/135; 257/263; 257/242; 257/347; 438/597; 438/620; 438/627; 438/639; 438/653
(58) Field of Classification Search
 USPC ................. 257/134, 135, 263, 288, 242, 347; 438/597, 620, 627, 639, 653
 See application file for complete search history.

(56) References Cited

U.S. PATENT DOCUMENTS

| | | | | |
|---|---|---|---|---|
| 6,448,657 B1 * | 9/2002 | Dorleans | ..................... | 257/774 |
| 6,803,281 B2 * | 10/2004 | Numazawa et al. | .......... | 438/270 |
| 6,930,019 B2 * | 8/2005 | Suh | ............................... | 438/438 |
| 6,933,569 B2 * | 8/2005 | Koh et al. | ...................... | 257/347 |
| 7,608,892 B2 * | 10/2009 | Sakakura | ....................... | 257/347 |
| 7,619,280 B2 * | 11/2009 | Cao et al. | ...................... | 257/330 |
| 7,719,056 B2 * | 5/2010 | Hamamoto | ................... | 257/347 |
| 7,884,002 B2 | 2/2011 | Muller | | |
| 8,067,804 B2 * | 11/2011 | Maegawa et al. | ............. | 257/349 |
| 8,232,171 B2 * | 7/2012 | Engelmann et al. | .......... | 438/299 |
| 8,324,058 B2 * | 12/2012 | Cheng et al. | .................. | 438/294 |
| 8,390,065 B2 * | 3/2013 | Yamazaki | ...................... | 257/347 |
| 8,426,918 B2 * | 4/2013 | Yamazaki | ...................... | 257/347 |
| 8,592,883 B2 * | 11/2013 | Claeys et al. | .................. | 257/303 |
| 2010/0327351 A1 * | 12/2010 | Yamazaki | ...................... | 257/347 |
| 2012/0112279 A1 * | 5/2012 | Cheng et al. | .................. | 257/347 |

FOREIGN PATENT DOCUMENTS

| | | |
|---|---|---|
| JP | 2009-517860 | 4/2009 |
| KR | 10-0548572 | 1/2006 |

* cited by examiner

*Primary Examiner* — Matthew W Such
*Assistant Examiner* — Stephen C Smith
(74) *Attorney, Agent, or Firm* — Lee & Morse, P.C.

(57) ABSTRACT

A semiconductor device includes a gate structure on a semiconductor substrate, an impurity region at a side of the gate structure and the impurity region is within the semiconductor substrate, an interlayer insulating layer covering the gate structure and the impurity region, a contact structure extending through the interlayer insulating layer and connected to the impurity region, and an insulating region. The contact structure includes a first contact structure that has a side surface surrounded by the interlayer insulating layer and a second contact structure that has a side surface surrounded by the impurity region. The insulating region is under the second contact structure.

21 Claims, 28 Drawing Sheets

SEMICONDUCTOR DEVICE INCLUDING CONTACT STRUCTURE, METHOD OF FABRICATING THE SAME, AND ELECTRONIC SYSTEM INCLUDING THE SAME

CROSS-REFERENCE TO RELATED APPLICATION

Korean Patent Application No. 10-2011-0054704 filed on Jun. 7, 2011, in the Korean Intellectual Property Office, and entitled: "Semiconductor Device Including Contact Structure, Method of Fabricating the Same, and Electronic System Including the Same," is incorporated by reference herein in its entirety.

BACKGROUND

With the high integration of semiconductor devices, parameters with respect to design rules are being scaled down. Thus, contact size may be decreased and contact resistance may be increased.

SUMMARY

Embodiments may be realized by providing a semiconductor device that includes a gate structure on a semiconductor substrate, an impurity region at a side of the gate structure and the impurity region is within the semiconductor substrate, an interlayer insulating layer covering the gate structure and the impurity region, a contact structure extending through the interlayer insulating layer and connected to the impurity region, the contact structure including a first contact structure having a side surface surrounded by the interlayer insulating layer and a second contact structure having a side surface surrounded by the impurity region, and an insulating region under the second contact structure.

A width of the insulating region may be greater than a width of the contact structure. The insulating region may extend through the impurity region. The insulating region may include a silicon oxide. The insulating region may include a silicon germanium oxide.

A height of the second contact structure may be greater than a quarter of a width of the second contact structure. The semiconductor device may include a silicon germanium region under the insulating region. The silicon germanium region may surround a bottom and a side surface of the insulating region.

The second contact structure may include a barrier layer on a sidewall thereof and may include a contact plug on the barrier layer. The semiconductor device may include a metal silicide layer surrounding a sidewall of the second contact structure.

Embodiments may also be realized by providing a semiconductor device that includes a lower layer, an insulating layer on the lower layer, a conductor extending into the lower layer through the insulating layer, and an insulating region arranged within the lower layer. The insulating region is in direct contact with a lower end portion of the conductor that extends into the lower layer.

The lower layer may include a doped silicon and the insulating region may include a silicon oxide. The conductor may include a first conductor penetrating the insulating layer, and a second conductor extending into the lower layer. A length of the second conductor extending into the lower layer may be larger than a quarter of a width of the second conductor.

The semiconductor device may include a barrier layer on a sidewall and a bottom surface of the second conductor. The semiconductor device may include a metal silicide layer surrounding a sidewall of the second conductor.

Embodiments may also be realized by providing a semiconductor device that includes a gate structure on an upper surface of a semiconductor substrate, an impurity region adjacent to the gate structure and the impurity region is within the semiconductor substrate, an interlayer layer covering the gate structure and the impurity region, a contact structure including a first portion extending through the interlayer layer and a second portion extending within the impurity region, and an insulating region within the impurity region. The insulating region is between a lower surface of the semiconductor substrate and a lower surface of the second portion of the contact structure.

The insulating region may be in direct contact with the lower surface of the second portion of the contact structure. A height of the second portion of the contact structure may be greater than a quarter of a width of the contact structure, the second portion of the contact structure may be entirely within the impurity region, and the first portion of the contact structure may be above the impurity region.

A width of the insulating region may be greater than the width of the contact structure, and the insulating region may be entirely within the impurity region. The interlayer layer may be directly on the impurity region, a height of the contact structure may be greater than a height of the interlayer layer, and along a width of the contact structure, the insulating region may separate at least a portion of the lower surface of the second portion of the contact structure from the impurity region.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
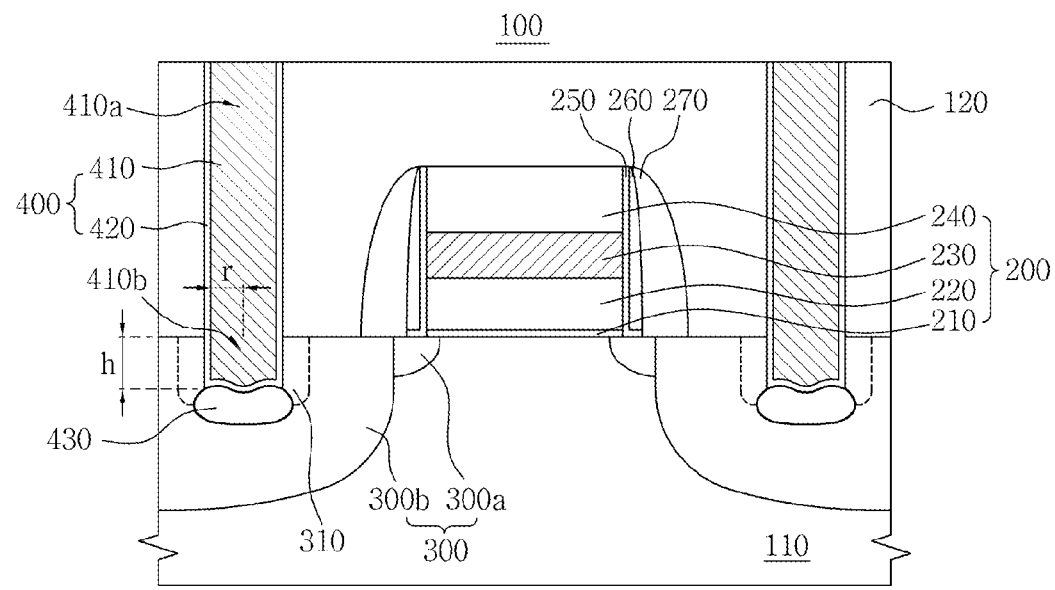
FIG. 1A illustrates a longitudinal cross-sectional view of a semiconductor device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Example embodiments are described herein with reference to cross-sectional illustrations that are schematic illustrations. As such, variations from the shapes of the illustrations as a result, e.g., of manufacturing techniques and/or tolerances, may be expected. Thus, example embodiments should not be construed as limited to the particular shapes of regions illustrated herein but may include deviations in shapes that result, e.g., from manufacturing. Thus, the regions illustrated in the figures are schematic in nature and their shapes do not necessarily illustrate the actual shape of a region of a device and do not limit the scope. Like reference numerals refer to like elements throughout.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

First Exemplary Embodiment

FIG. 1A illustrates a longitudinal cross-sectional view of a semiconductor device according to an exemplary embodiment.

Referring to FIG. 1A, a semiconductor device 100 may include a gate structure 200 disposed on a substrate 110. Impurity regions 300 may be formed within the substrate 110 at opposing sides of the gate structure 200. Contact structures 400, e.g., formed at the opposing sides of the gate structure 200, may form ohmic contacts with the impurity regions 300. The substrate 110 may include a semiconductor substrate, e.g., a silicon substrate, a silicon germanium (Si—Ge) substrate, a silicon on insulator (SOI) substrate, or a germanium on insulator (GOI) substrate. An interlayer insulating layer 120 may cover the gate structure 200 and may be provided on, e.g., directly on, the substrate 110. The contact structures 400 may extend through, e.g., in its entirety, the interlayer insulating layer 120.

The gate structure 200 may include, e.g., a gate insulating layer 210, a first gate conductive pattern 220, a second gate conductive pattern 230, and a gate capping pattern 240 sequentially stacked on the substrate 110. The gate insulating layer 210 may include a silicon oxide or a high-k dielectric. The high-k dielectric may include a dielectric having a higher dielectric constant than silicon oxide, for example, a dielectric such as an aluminum oxide or a hafnium oxide. The first gate conductive pattern 220 may include a doped silicon having conductivity, e.g., the silicon may be doped throughout the entire first gate conductive pattern 220. For example, the first gate conductive pattern 220 may include or may be a doped polysilicon layer. The second gate conductive pattern 230 may include a metal or metal compound, e.g., the second gate conductive pattern 230 may be formed entirely of the metal or metal compound. For example, the second gate conductive pattern 230 may be formed to include tungsten or tungsten silicide. The composition of the first gate conductive pattern 220 may be different from the composition of the second gate conductive pattern 230 such that they form two different, distinguishable layers. The gate capping pattern 240 may include, e.g., a silicon nitride, a material having an electrical insulating property, e.g., the gate capping pattern 240 may be composed entirely of an insulating material.

Spacers may be formed on the lateral sides of the gate structure 200. For example, protective spacers 250, offset spacers 260, and outer spacers 270 may be provided at the sides of the gate structure 200. The offset spacers 260 may serve as, e.g., a low concentration ion implantation mask. The outer spacers 270 may serve as, e.g., a high concentration ion implantation mask. The spacers 250, 260, and 270 may include an insulating material. For example, the spacers 250, 260, and 270 may each include a silicon oxide layer and/or a silicon nitride layer.

The impurity regions 300 may be provided within the substrate 110 at opposing sides of the gate structure 200, respectively. The impurity regions 300 may include a low concentration impurity region 300a, which may be formed adjacent to the gate structure 200. The impurity regions 300 may include a high concentration impurity region 300b having a higher, e.g., substantially higher, impurity concentration than the low concentration impurity region 300a. The high concentration impurity region 300b may be arranged adjacent to the low concentration impurity region 300a and spaced apart from the gate structure 200. The impurity regions 300 may further include an additional impurity region 310 in a region adjacent to the contact structure 400. The additional impurity region 310, the low concentration impurity region 300a, and the high concentration impurity region 300b may include impurities having the same conductivity type. A net concentration of impurities in each of the additional impurity region 310, the low concentration impurity region 300a, and the high concentration impurity region 300b may be different. Detailed description of the additional impurity region 310 will be made later.

The interlayer insulating layer 120 may be provided on the substrate 110 having the gate structure 200 and the impurity regions 300. The interlayer insulating layer 120 may overlap, e.g., to be in direct contact with, the impurity regions 300 and the gate structure 200.

The contact structure 400 may penetrate the interlayer insulating layer 120 to extend below a surface of the substrate 110, i.e., to also penetrate the substrate 110. The contact structure 400 may be connected to or in contact with the impurity region 300, e.g., the contract structure 400 may extend through an upper portion of the impurity region 300. The contact structure 400 may be formed in a structure in which a portion of the contact structure 400 may be buried below the surface of the substrate 110. The contact structure 400 may be formed to be in contact with the impurity region 300 such that a lateral side of the contract structure 400 contacts a portion of the impurity region 300. The contact structure 400 may include, e.g., a contact plug 410 and a barrier layer 420. The barrier layer 420 may cover a sidewall, e.g., entirely cover the sidewalls, and a bottom of the contact plug 410. For example, the contact plug 410 may be spaced apart from the interlayer insulating layer 120 by the barrier layer 420. The barrier layer 420 may have conductivity, e.g., may be formed of a conductive material.

The contact structure 400 may include an upper contact structure 410a penetrating the interlayer insulating layer 120, and a lower contact structure 410b of which a side surface is surrounded by the impurity region 300. The upper contact structure 410a may extend through the interlayer insulating layer 120, e.g., through an entire height of the interlayer insulating layer 120. The lower contact structure 410b may be buried within the impurity region 300, e.g., may extend through a portion of the impurity region. For example, the lower contact structure 410b may have a side height of "h".

The contact structure 400 may be pillar-shaped. For example, the contact structure 400 may be cylinder-shaped or polyprism-shaped. Since the bottom of the contact structure 400 may be in contact with an insulating region 430, the side surface of the lower contact structure 410b may form an ohmic contact with the impurity region 300.

The insulating region 430 may be provided under the bottom of the lower contact structure 410b of the contact structure 400, e.g., between a lowermost surface of the substrate 110 and a lowermost surface of the lower contact structure 410b. For example, the insulating region 430 may be formed entirely within the impurity region 300. Alternatively, an insulating region may be formed partially within the impurity region 300, as discussed below in another exemplary embodiment. The insulating region 430 may have a larger width than a width of the contact structure 400. For example, the insulation region 430 may be in contact with a lower surface of the contact structure 400 in its entirety. The insulation region 430 may separate at least a portion of the lower surface of the contact structure 400 from the impurity region 300. The width may be measured in a direction between the contact structure 400 and the gate structure 200.

The insulating region 430 may have a downward convex shape. The insulating region 430 may be formed of a plurality of curved surfaces so as to form a convex polygonal shape. The insulating region 430 may have a substantially biconvex shape, e.g., upper and lower surfaces of the insulating region 430 may include at least one convex region. The upper surface of the insulating region 430 may include at least two convex regions spaced apart from each other, e.g., by a concave region, and both opposing the lower surface. For example, a center portion of the upper surface of the insulating region 430 may include a recess region that is lower than side portions of the upper surface of the insulating region 430.

The insulating region 430 may include, e.g., a silicon oxide layer. The insulating region 430 may provide an end point of the contact structure 400 and reduce a leakage current. For example, a bottom surface of the barrier layer 420 may be in direct contact the upper surface of the insulating region 430. A shape of the bottom surface of the barrier layer 420 may correspond to the shape of the upper surface of the insulating region 430. A detailed description will be made later.

Figure 1B:
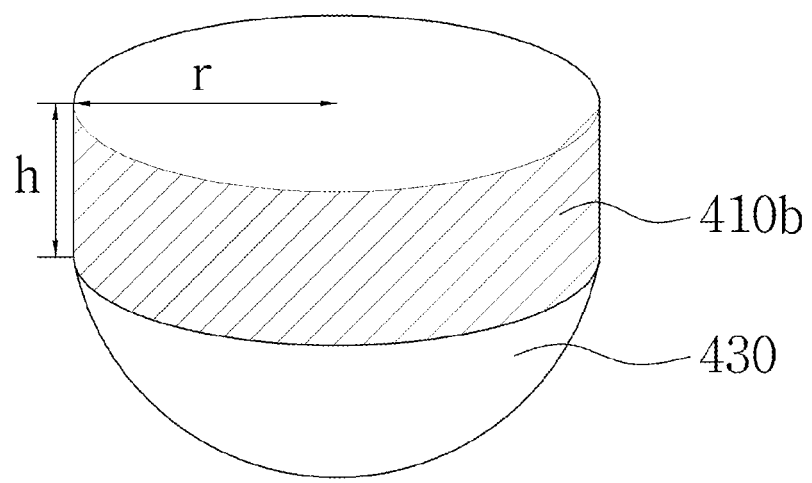
FIG. 1B illustrates a perspective view of a part of a contact structure according to an exemplary embodiment.

FIG. 1B illustrates a perspective view of a part of an exemplary contact structure in which a contact area is formed between the contact structure 400 and the impurity region 300. To easily understand the embodiments, a lateral section of the contact structure 400 is illustrated as having a circular shape. However, the lateral section of the contact structure 400 may have another shape such as an elliptical or polygonal shape.

Referring to FIGS. 1A and 1B, the contact area between the contact structure 400 and the impurity region 300 may be an area of the side surface of the lower contact structure 410b. For example, according to an exemplary embodiment, if it is assumed that the lower contact structure 410b is cylinder-shaped and has a radius of "r", the lower contact structure 410b may have a circumference of "$2\pi r$". Since the side height of the lower contact structure 410b is "h", it is seen that the area of the side surface of the lower contact structure 410b may be "$2\pi rh$". That is, the contact area between the lower contact structure 410b and the impurity region 300 may be "$2\pi rh$". Therefore, the larger the height "h" of the lower contact structure 410b that is buried within the impurity region 300, the larger the contact area ($2\pi rh$) between the lower contact structure 410b and the impurity region 300. Since contact resistance is inversely proportional to the contact area, as the contact area increases, contact resistance decreases.

On the other hand, an area of the bottom of the lower contact structure 410b may be "$\pi r^2$". If the lower contact structure 410b is omitted and the bottom of the contact structure 400 is in direct contact with an upper surface of the impurity region 300, a contact area between the bottom of the contact structure 400 and the upper surface of the impurity region 300 may be "$\pi r^2$". As in the exemplary embodiment, when the lower contact structure 410b is formed and the insulating region 430 is provided under the lower contact structure 410b, a contact area of the contact structure 400 with the impurity region 300 is "$2\pi rh$", and if "h=r/2", the equation $2\pi rh = 2\pi r*(r/2) = \pi r^2$ may be derived. From the equation, in the condition that "h>r/2", the contact area of the lower contact structure 410b with the impurity region 300 is larger than the contact area when the bottom of the contact structure 400 is in direct contact with the upper surface of the impurity region 300.

Accordingly, in exemplary embodiments, when considering contact resistance, the height "h" of a portion of the lower contact structure 410b in direct contact with the impurity region 300 be larger than half of the radius r (r/2) of the lower contact structure 410b. For example, according to variously shapes of the contact structure 400, the height "h", e.g., along a first direction, of the lower contact structure 410b may be larger than a quarter of a total width, e.g., along a second direction perpendicular to the first direction, of the lower contact structure 410b. When the insulating region 430 is omitted, the side surface and bottom of the lower contact structure 410b have an ohmic contact so that contact resistance can be reduced, e.g., considerably reduced. In a transistor including a source/drain formed in a shallow junction structure, a leakage current may be a problem. The insulating region 430 provided under the lower contact structure 410b may reduce, e.g., significantly reduce, the leakage current generated in the source/drain, e.g., generated in the impurity region 300.

When the lateral section of the contact structure 400 is an ellipse or a polygon, the radius "r" used in the specification may denote half of a width.

Second Exemplary Embodiment

Figure 2A:
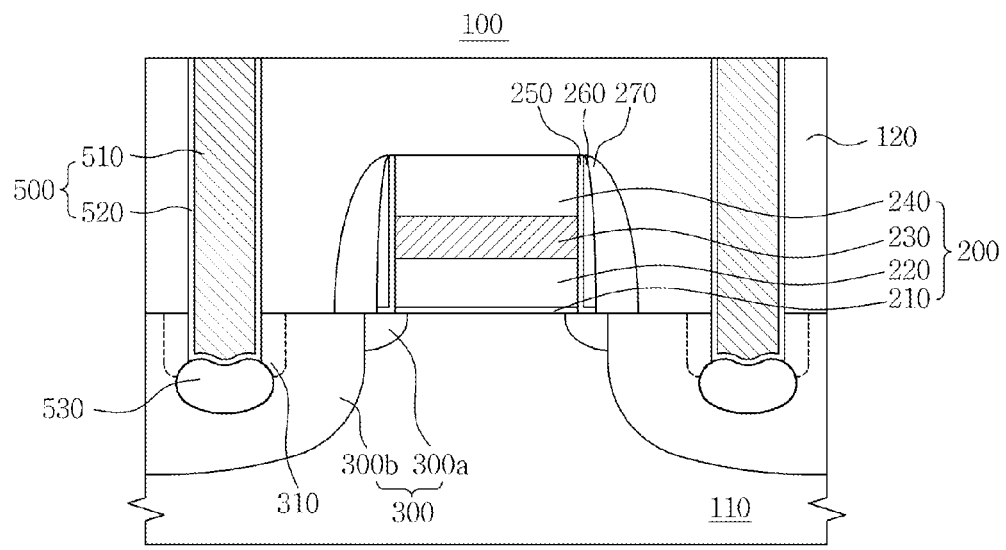
FIGS. 2A and 2B illustrate longitudinal cross-sectional views of semiconductor devices according to other exemplary embodiments.
Figure 2B:
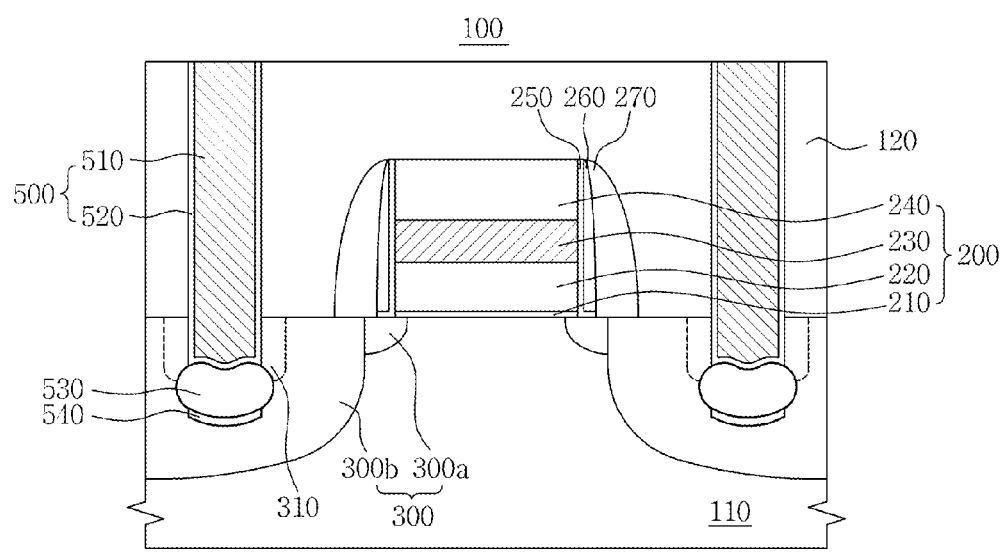

FIGS. 2A and 2B illustrate longitudinal cross-sectional views of a semiconductor device according to other exemplary embodiments for insulating regions under a contact structure.

Referring to FIG. 2A, in a semiconductor device 100 according to another exemplary embodiment, an insulating region 530 may include a silicon oxide containing germanium (Si—Ge—O). When the insulating region 530 further contains Ge, the insulating region 530 containing Ge may be thicker, e.g., in a vertical direction, than the insulating region 430 that may not include Ge (see FIG. 1A). The insulating region 530 may have a shape substantially the same as or similar to the shape of the insulating region 430. The insulating region 530 may be more effective for reducing the possibility of and/or preventing a leakage current. A contact structure 500 that is the same as or similar to the contact structure 400 may be in contact with the insulating region 530, e.g., the contact structure 500 may include a contact plug 510 and a barrier layer 520. The insulating region 530 may be in direct contact with the barrier layer 520.

Referring to FIG. 2B, a semiconductor device 100 according to another exemplary embodiment, may include an insulating region 530 including a silicon oxide containing Ge (Si—Ge—O), and a silicon germanium (Si—Ge) region 540 doped with Ge under, e.g., directly under, the insulating region 530. The insulating region 530 and the silicon germanium region 540 may be distinct layers that are in direct contact with each other. The silicon germanium region 540 may have conductivity. The contact structure 500, which may be the same as or similar to contact structure 400, may be in contact with the insulating region 530 while spaced apart from the silicon germanium region 540.

Third Exemplary Embodiment

Figure 3A:
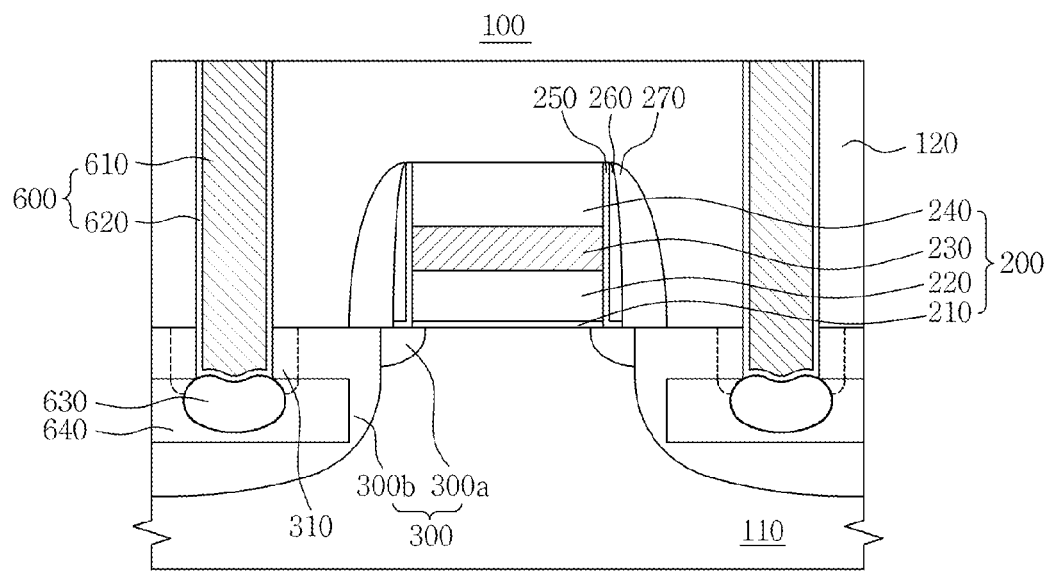
FIGS. 3A and 3B illustrate longitudinal cross-sectional views of semiconductor devices according to another exemplary embodiment.
Figure 3B:
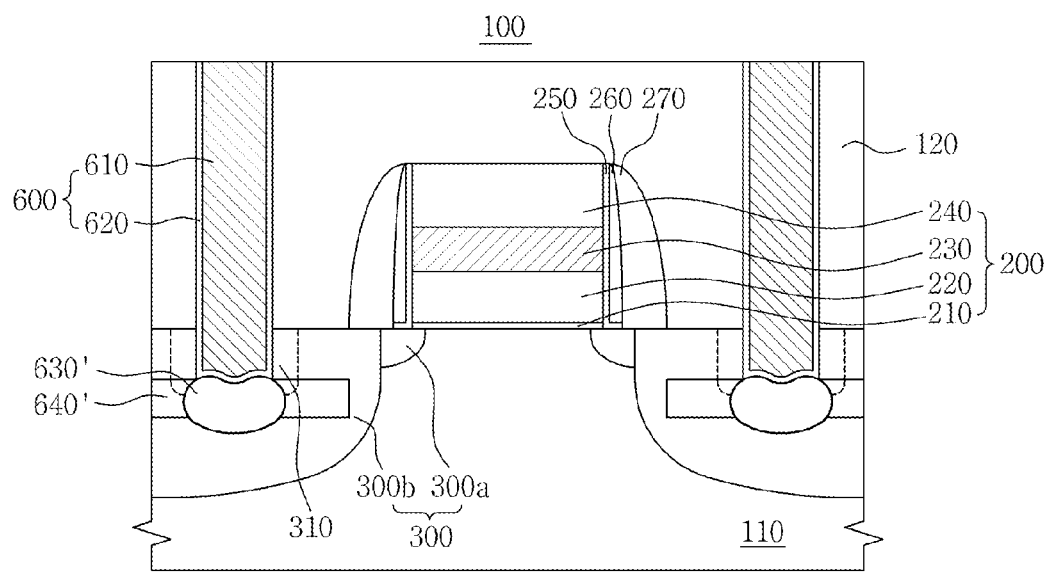

FIGS. 3A and 3B illustrate longitudinal cross-sectional views of semiconductor devices according to another exemplary embodiment for insulating regions within impurity regions.

Referring to FIG. 3A, a substrate 110 may include a silicon germanium (Si—Ge) region 640 doped with Ge within the impurity region 300. The silicon germanium region 640 may surround, e.g., entirely surround, a bottom and a side surface of an insulating layer region 630. For example, the silicon germanium region 640 may surround all regions of the insulating layer region 630 that are not in contact with a contact structure 600. The silicon germanium region 640 may be formed entirely within the impurity region 300.

The silicon germanium region 640 may be wider and thicker than the contact structure 600. The contact structure 600 may be the same as or similar to the contact structures 400 and/or 500, e.g., the contact structure 600 may include a contact plug 610 and a barrier layer 620. The insulating layer region 630 may be the same as or similar to the insulating layer regions 430 and/or 530, e.g., so that an upper surface of the insulating layer region 630 is in direct contact with the barrier layer 620. Other surfaces of the insulating layer region 630 may be in direct contact with the silicon germanium region 640.

Referring to FIG. 3B, according to another exemplary embodiment, a bottom of an insulating layer region 630' may be exposed below a silicon germanium (Si—Ge) region 640' doped with Ge, e.g., the insulating layer region 630' may have a greater height than the silicon germanium region 640'. The silicon germanium region 640' may be wider and thinner than a contact structure 600.

Fourth Exemplary Embodiment

Figure 4:
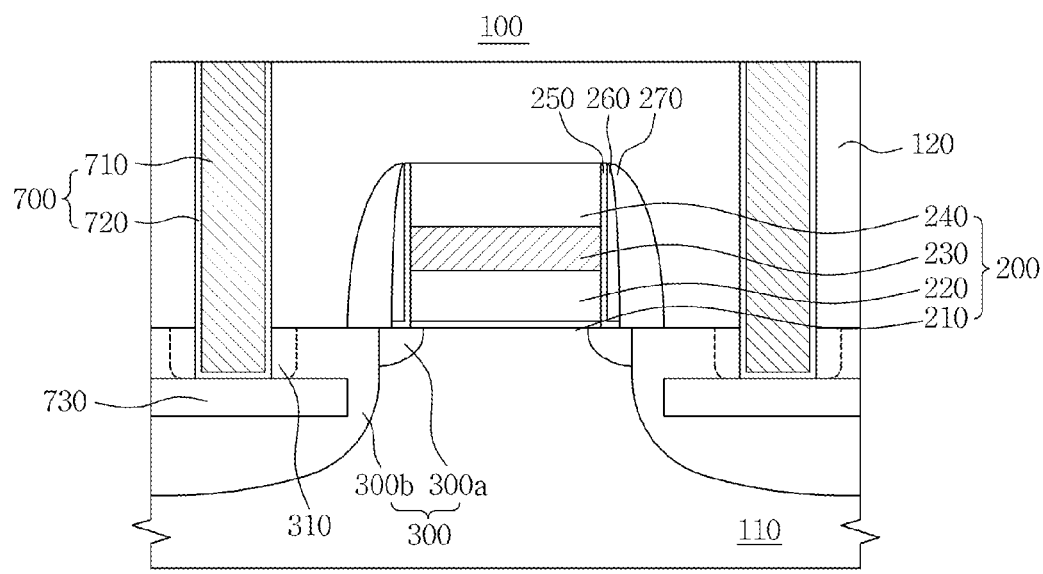
FIG. 4 illustrates a longitudinal cross-sectional view of a semiconductor device according to another exemplary embodiment.

FIG. 4 illustrates a longitudinal cross-sectional view of a semiconductor device according to another exemplary embodiment for an insulating region within an impurity region.

Referring to FIG. 4, a substrate 110 may include an insulating layer region 730 extending under a contact structure 700, e.g., under a contact plug 710 of the contact structure, in a horizontal direction. The insulating layer region 730 may be entirely formed within the impurity region 300. The contact structure 700 may be substantially the same as or similar to the contact structure 400, 500, and/or 600, e.g., the contact structure 700 may include the contact plug 710 and a barrier layer 720. The barrier layer 720 may be in direct contact with the insulating layer region 730.

The insulating layer region 730 may include a silicon oxide containing Ge (Si—Ge—O). The insulating layer region 730 may be formed so that a width of the insulating layer region 730 may be sufficiently larger than a width of the contact plug 710. The width of the insulating layer region 730 may also be larger than a combined width of the contact structure 700 and the additional impurity region 310. Thus, the insulating layer region 730 may widely block a leakage current under the contact structure 700.

Fifth Exemplary Embodiment

Figure 5:
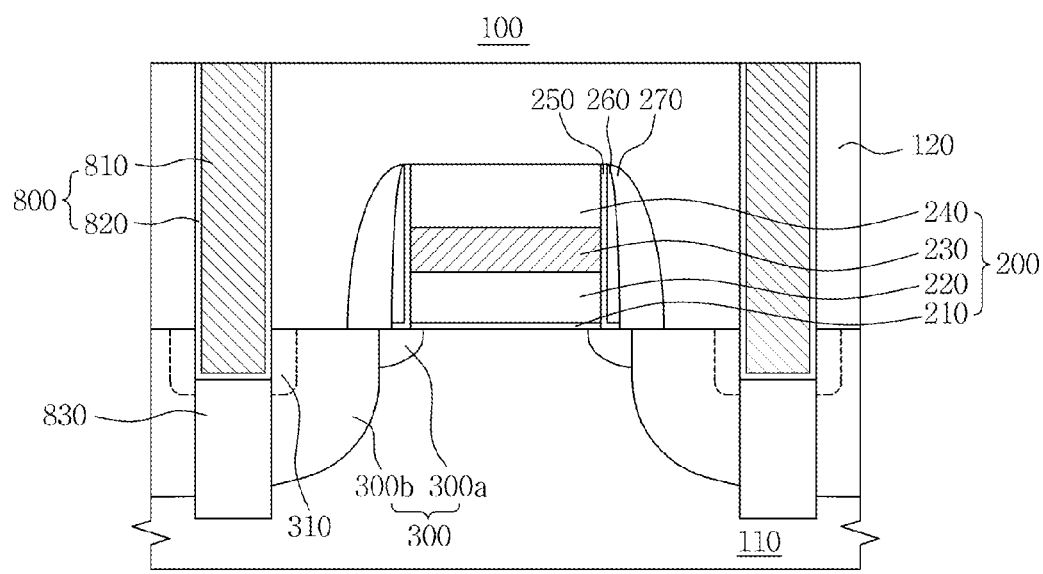
FIG. 5 illustrates a longitudinal cross-sectional view of a semiconductor device according to another exemplary embodiment.

FIG. 5 illustrates a longitudinal cross-sectional view of a semiconductor device according to another exemplary embodiment for an insulating region within an impurity region.

Referring to FIG. 5, a substrate 110 may include an insulating layer region 830 under a contact structure 800. The insulating layer region 830 may have the same width as or a similar width to the contact structure 800, e.g., lateral sides of the insulating layer region 830 and the contact structure 800 may be substantially vertically aligned. The insulating layer region 830 may partially extend outside the impurity region 300, e.g. may extend a distance under the impurity region 300. For example, the insulating layer region 830 may extend under the impurity region 300 so as to be exposed below the impurity region 300. The contact structure 800 may be substantially the same as or similar to the contact structure 400, 500, 600, and/or 700, e.g., the contact structure 800 may include a contact plug 810 and a barrier layer 820. The insulating layer region 830 may include a silicon oxide.

Sixth to Tenth Exemplary Embodiments

FIGS. 6 to 10 illustrate longitudinal cross-sectional views of semiconductor devices according to other exemplary embodiments of upper and lower portions of contact structures.

Referring to FIGS. 6 to 10, contact structures 400, 500, 600, 700, and 800 may include upper contact structures 410a, 510a, 610a, 710a, and 810a, and lower contact structures 410b, 510b, 610b, 710b, and 810b, respectively. The contact structures 400, 500, 600, 700, and 800 may also include metal silicide layers 412, 512, 612, 712, and 812, respectively. The metal silicide layers 412, 512, 612, 712, and 812 may surround sidewalls of the lower contact structures 410b, 510b, 610b, 710b, and 810b, respectively. For example, the metal silicide layers 412, 512, 612, 712, and 812 may surround outer walls of barrier layers 420, 520, 620, 720, and 820 surrounding sidewalls of contact plugs 410, 510, 610, 710, and 810, respectively. The metal silicide layers 412, 512, 612, 712, and 812 may abut upper surfaces of the insulating regions 430, 530, 630, 730, and 830, respectively.

The metal silicide layers 412, 512, 612, 712, and 812 may further reduce contact resistances between the contact structures 400, 500, 600, 700, and 800 and the impurity regions 300. The metal silicide layers 412, 512, 612, 712, and 812 may include at least one of nickel silicide (NiSi), titanium silicide (TiSi$_2$), and cobalt silicide (CoSi$_2$). The metal silicide layers 412, 512, 612, 712, and 812 may be arranged between the impurity region 300, e.g., the additional impurity region 310, and the barrier layers 420, 520, 620, 720, and 820, respectively. The contact structures 400, 500, 600, 700, and 800 may have a stepped structure due to the metal silicide layers 412, 512, 612, 712, and 812, respectively. For example, a width of the portions of the contact structures 400, 500, 600, 700, and 800 arranged within the impurity region 300 may be smaller than a width of portions arranged above the impurity region 300.

Hereinafter, methods of fabricating the semiconductor devices having the above-described configurations according to exemplary embodiments will be described in detail with reference to the accompanying drawings.

Figure 11:
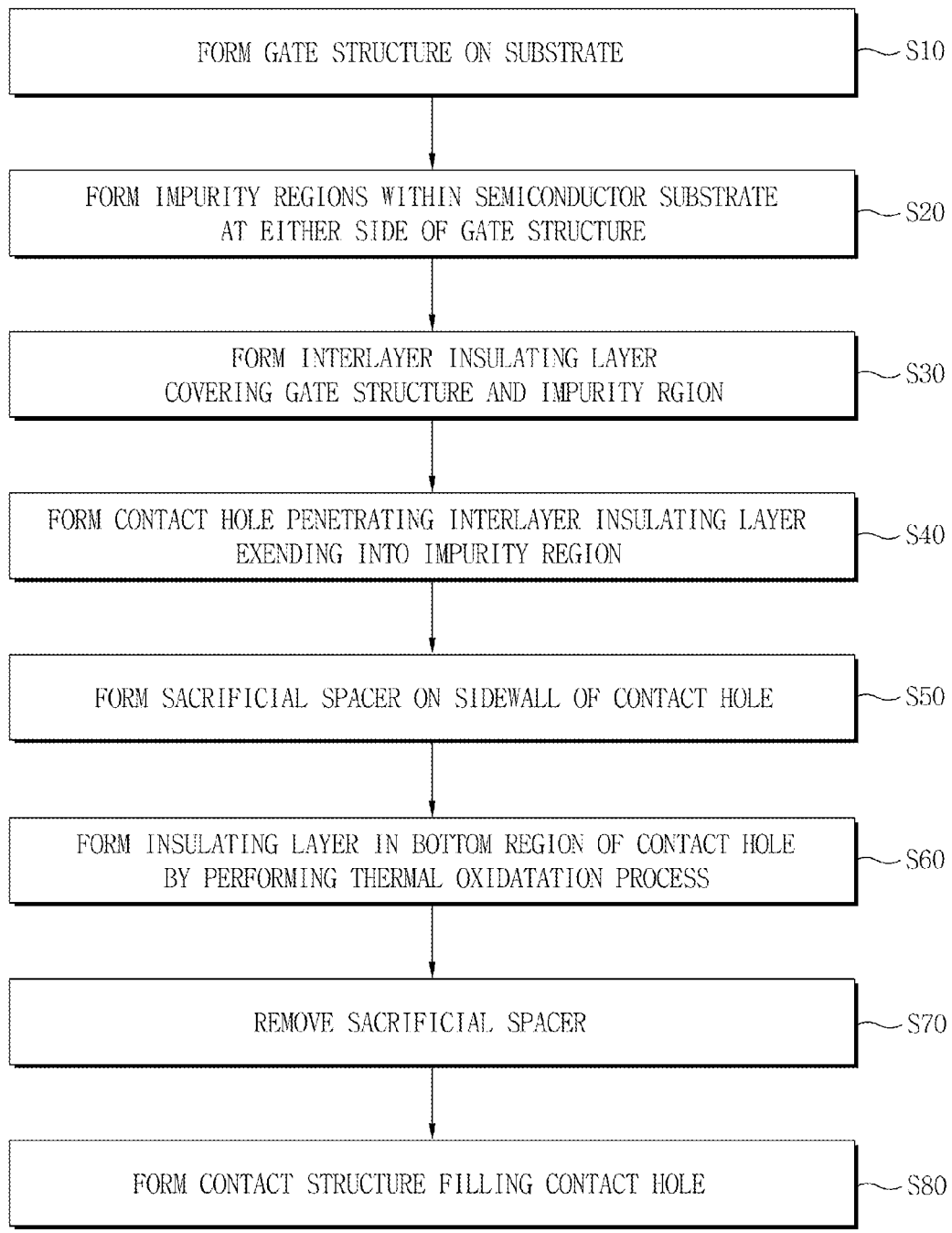
FIG. 11 illustrates a sequence diagram schematically depicting stages in a method of fabricating a semiconductor device according to an exemplary embodiment.

FIG. 11 illustrates a sequence diagram schematically depicting stages in a method of fabricating a semiconductor device according to an exemplary embodiment.

Referring to FIG. 11, a method of fabricating a semiconductor device may include forming a gate structure (S10) and forming impurity regions within a semiconductor substrate at opposing sides of the gate structure (S20). Next, the method may include forming an interlayer insulating layer covering the gate structure and the impurity regions (S30), and forming a contact hole penetrating the interlayer insulating layer to extend into one of the impurity regions (S40). Thereafter, the method may include forming a sacrificial spacer on a sidewall of the contact hole (S50), and forming an insulating layer in a bottom region of the contact hole (that includes the sacrificial spacer therein) by performing a thermal oxidation process (S60). After forming the insulating layer, the method may include removing the sacrificial spacer (S70), and forming a contact structure filling the contact hole (S80).

According to another exemplary embodiment, the method may include forming a plasma doping region within the impurity region between the removal of the sacrificial spacer (S70) and before forming the contact structure (S80). The method may further include forming a metal silicide layer in an exposed impurity region between the stage of the removal of the sacrificial spacer (S70) and the stage of the forming of the contact structure (S80).

Hereinafter, a method of fabricating a semiconductor device according to exemplary embodiments will be described. Similar stages may be used to fabricate semiconductor devices according to other embodiments, which include the exemplary embodiments discussed above.

First Exemplary Embodiment of Fabrication Method

Figure 12A:
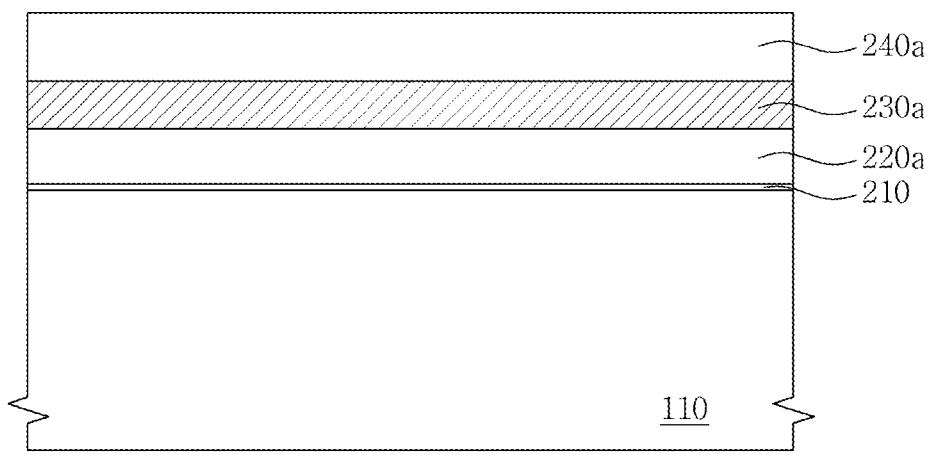
FIGS. 12A to 12P illustrate cross-sectional views depicting stages in a method of fabricating a semiconductor device according to an exemplary embodiment.
Figure 12B:
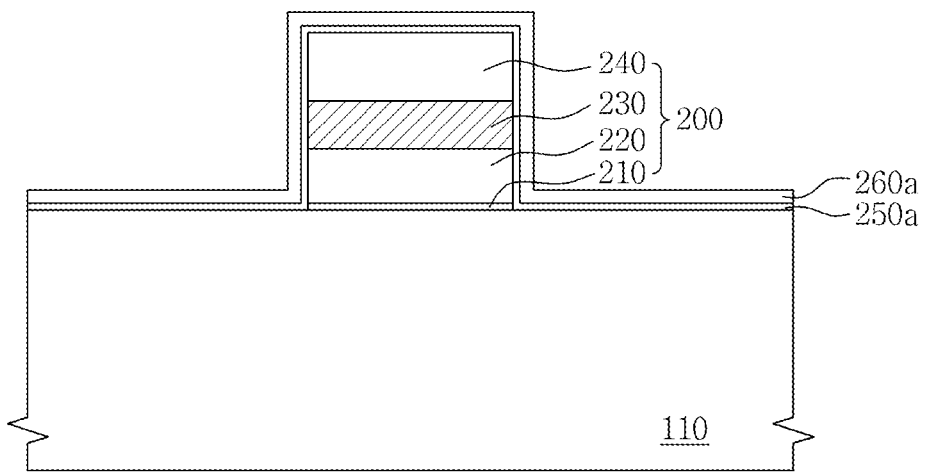
FIG. 12Q illustrates a cross-sectional view depicting a stage in a method of fabricating a semiconductor device according to another exemplary embodiment.
Figure 12C:
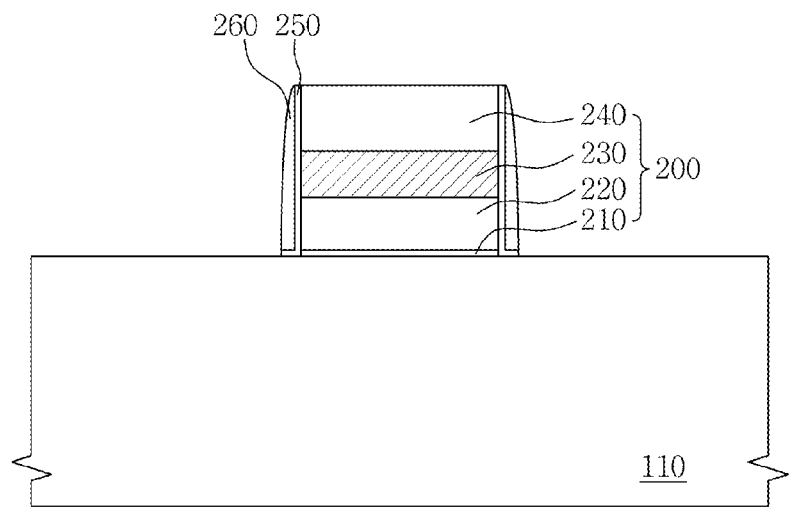
Figure 12D:
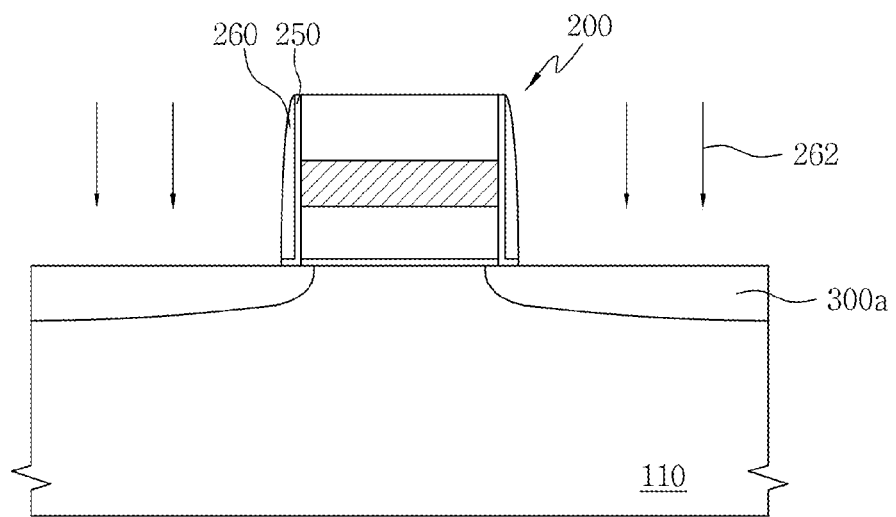
Figure 12E:
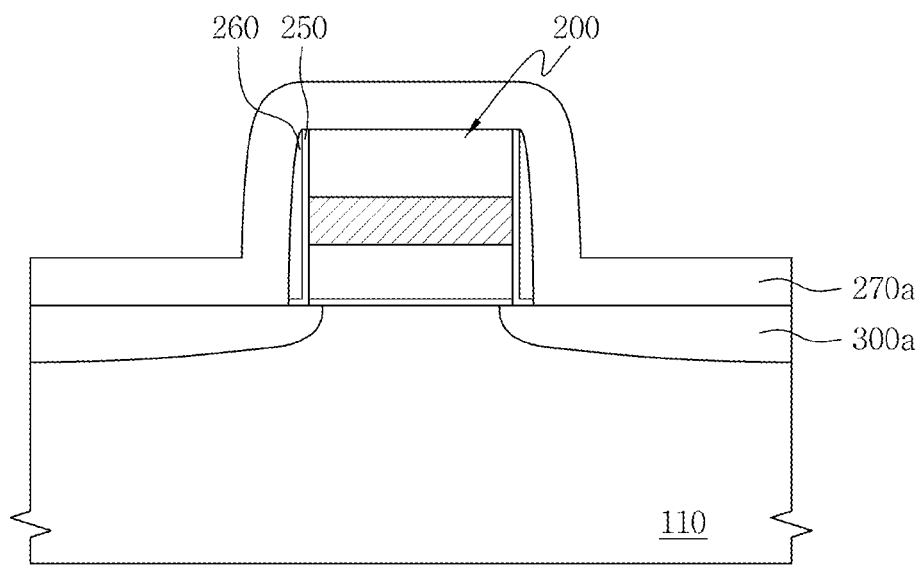
Figure 12F:
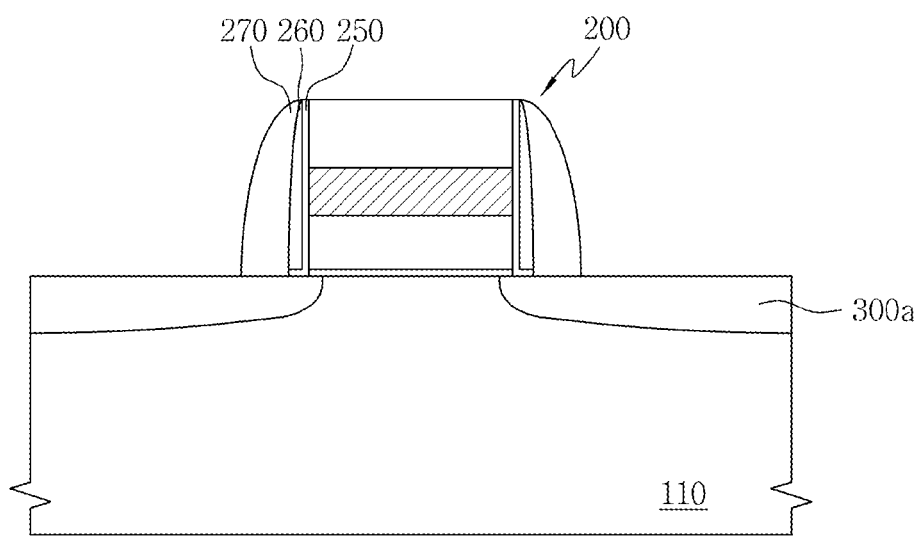
Figure 12G:
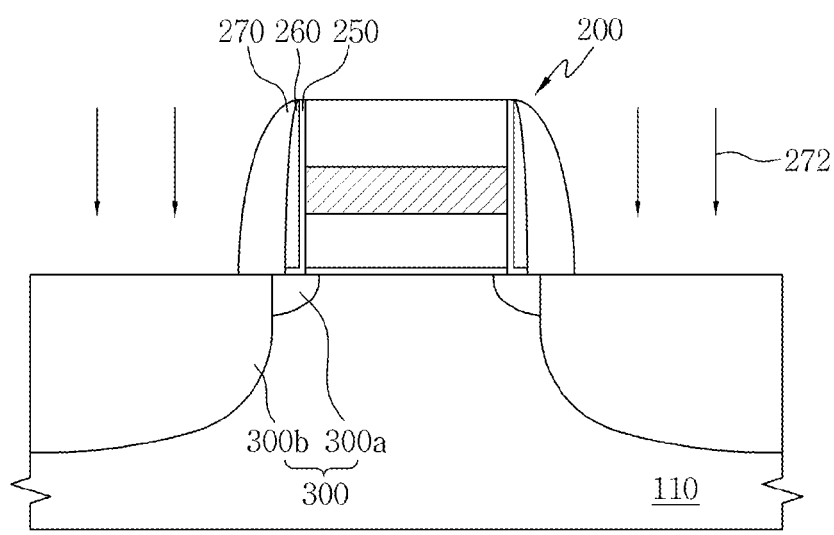
Figure 12H:
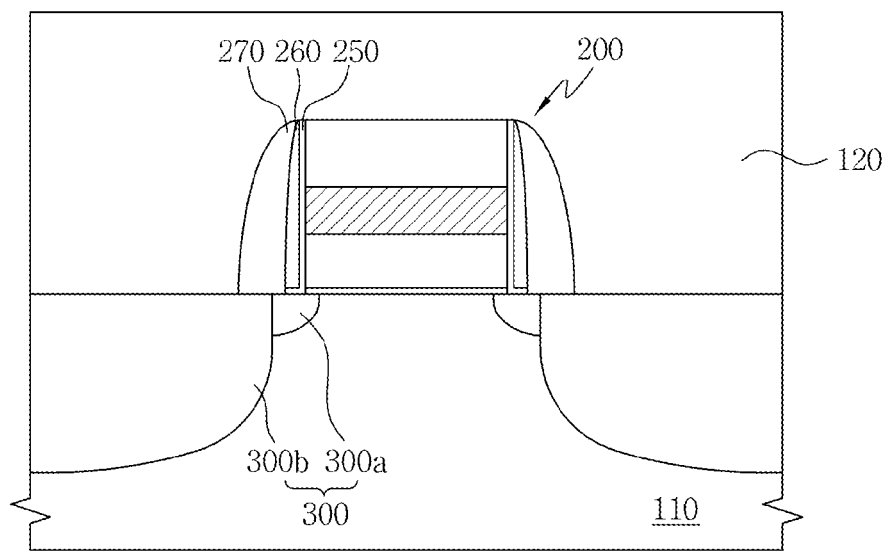
Figure 12I:
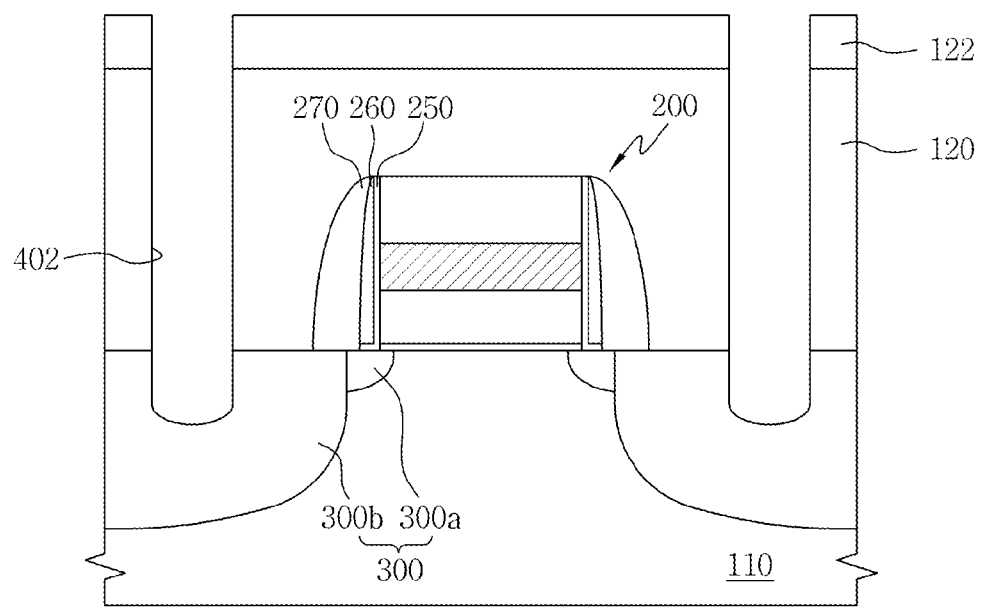
Figure 12J:
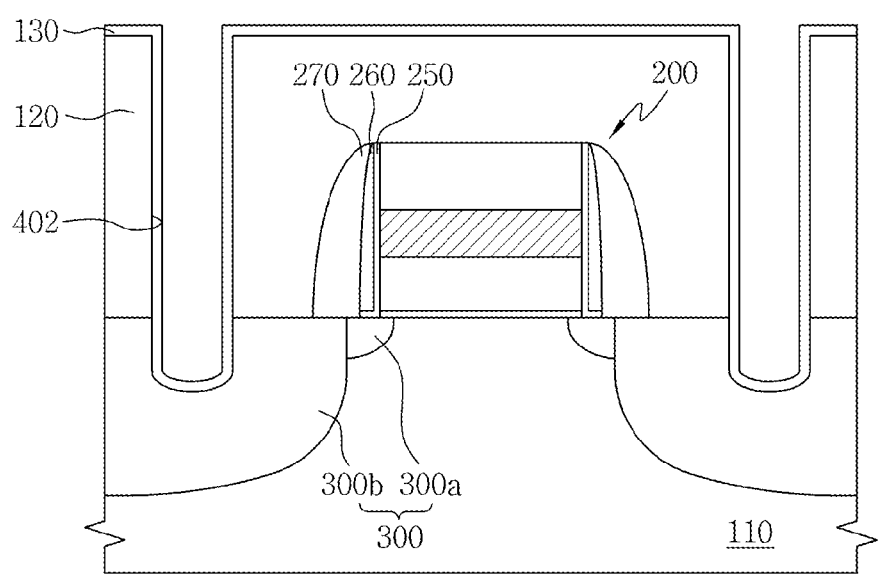
Figure 12K:
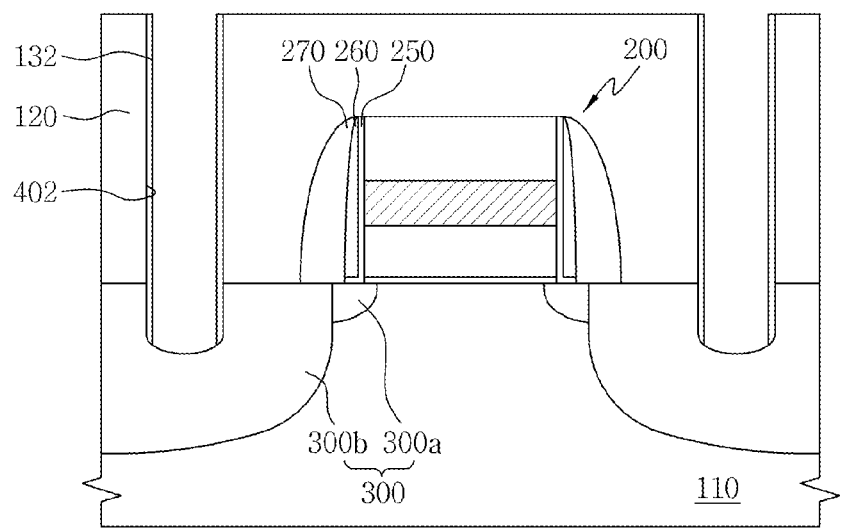
Figure 12L:
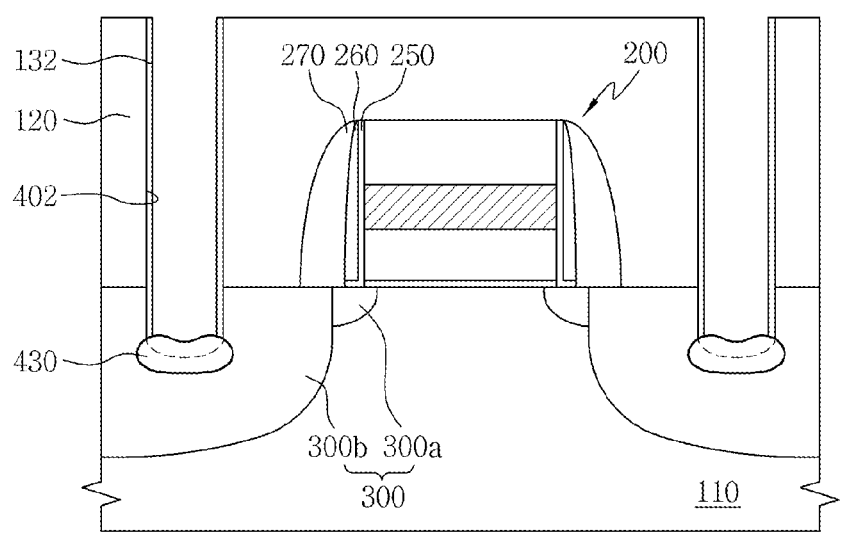
Figure 12M:
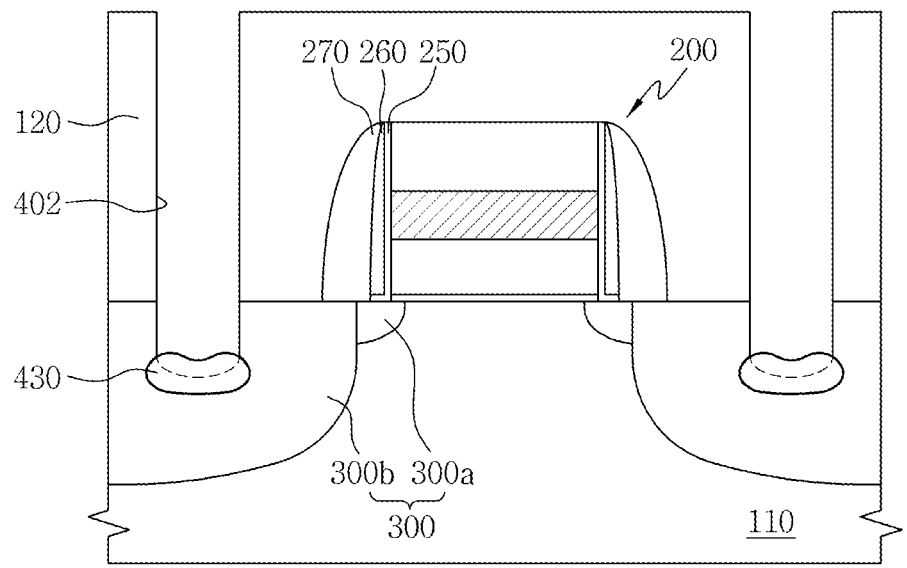
Figure 12N:
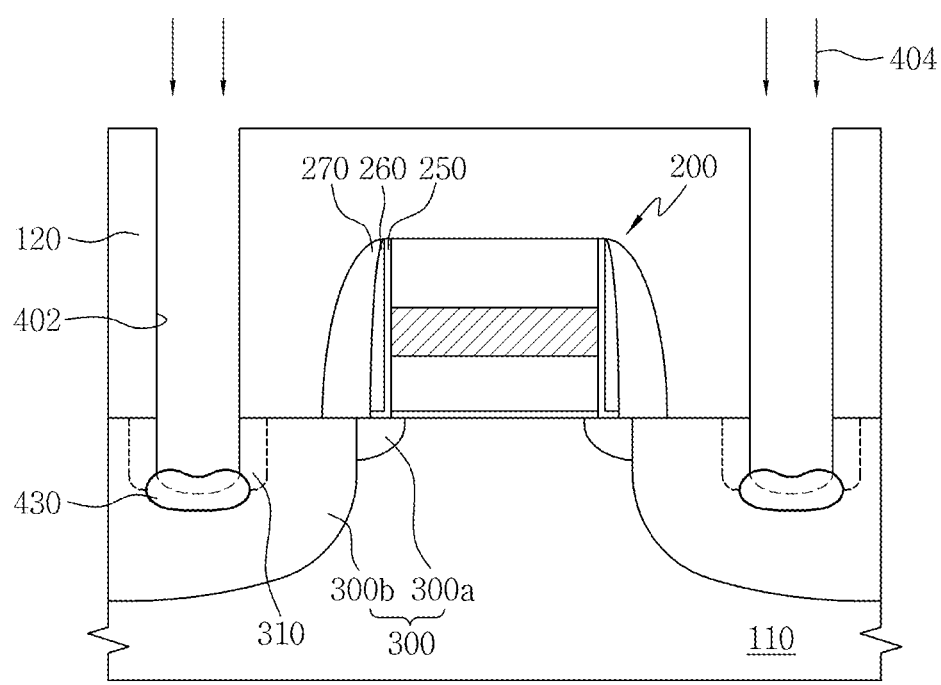
Figure 12O:
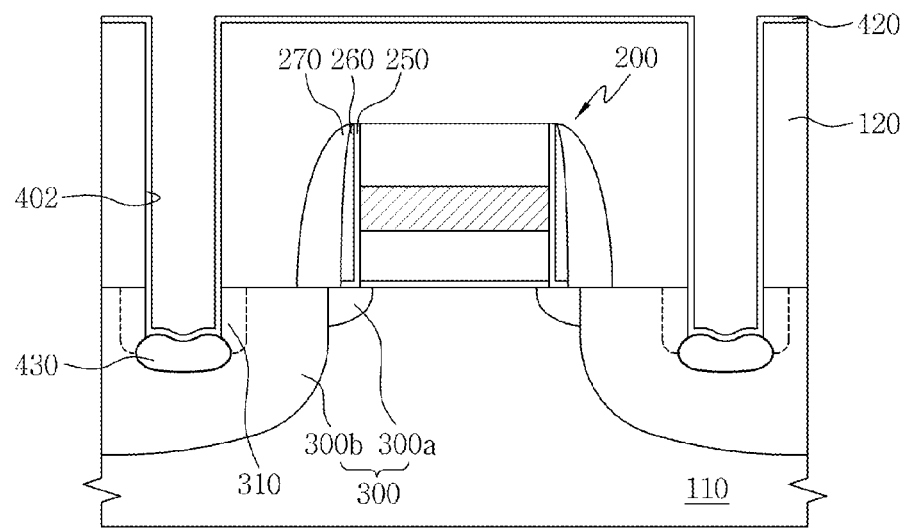
Figure 12P:
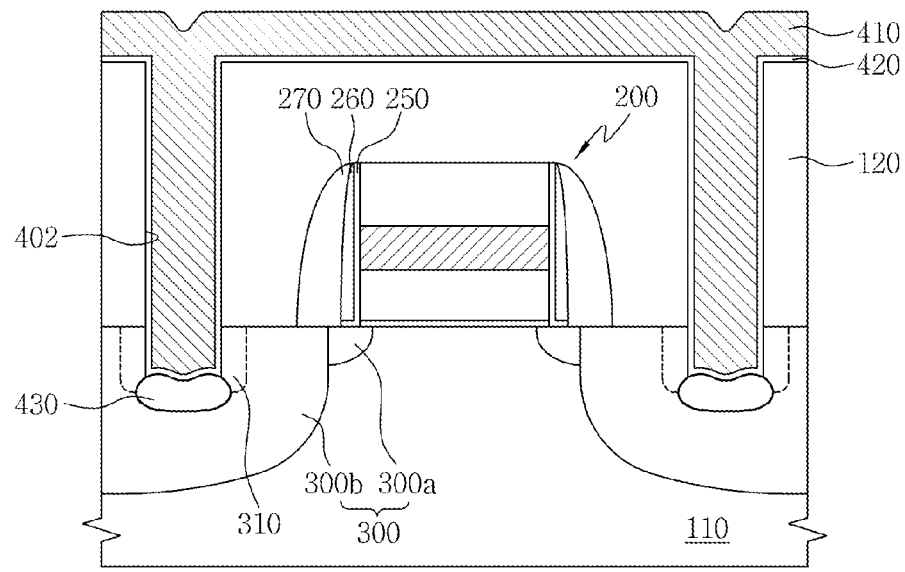

FIGS. 12A to 12P illustrate cross-sectional views depicting stages in a method of fabricating a semiconductor device described in FIG. 1A that includes the impurity region 430, according to an exemplary embodiment.

Referring to FIG. 12A, a gate insulating layer 210, a first conductive layer 220a, a second conductive layer 230a, and a gate capping layer 240a may be sequentially stacked on a substrate 110. The first conductive layer 220a may include, e.g., a doped silicon layer. The second conductive layer 230a may include, e.g., a metal layer or a metal silicide layer. The gate capping layer 240a may include, e.g., a silicon nitride layer or a silicon oxynitiride layer.

Referring to FIG. 12B, a patterning process for the gate capping layer (240a of FIG. 12A) may be performed. The gate capping layer 240a may be patterned to a gate capping pattern 240 through photolithography and etching processes.

The second conductive layer 230a and the first conductive layer 220a may be etched using the gate capping pattern 240 as an etch mask. Thereby, a gate structure 200 including the gate insulating layer 210, a first gate conductive pattern 220, a second gate conductive pattern 230, and the gate capping pattern 240 sequentially stacked on the substrate 110 may be formed.

A surface protective layer 250a may be formed on the gate structure 200 and on the substrate 110 to a predetermined thickness. The surface protective layer 250a may include, e.g., a silicon oxide layer. The surface protective layer 250a may cure silicon damage caused by the above-described etching process. The surface protective layer 250a may be formed on sidewalls of the first gate conductive pattern 220 constituted of at least a doped silicon layer.

An offset insulating layer 260a may be formed on the surface protective layer 250a, i.e., on the gate structure 200 and the on the substrate 110. The offset insulating layer 260a may include, e.g., a silicon oxide layer, a silicon nitride layer, or a silicon oxynitride layer formed by a chemical vapor deposition (CVD) method. The offset insulating layer 260a may have an etch selectivity with respect to silicon (Si).

Referring to FIG. 12C, the surface protective layer 250a of FIG. 12B and the offset insulating layer 260a of FIG. 12B may be anisotropically etched to form protective spacers 250 and offset spacers 260, respectively, on opposing sidewalls of the gate structure 200. For example, the protective spacers 250 may be formed to have an L-shape, e.g., to include a first portion aligned with one entire sidewall of the gate structure and a second portion bent from the first portion that is aligned with the substrate 110. The offset spacers 260 may be formed on the protective spacers 250, e.g., a bottom surface of one offset spacer 260 may be spaced apart from the substrate 110 by the second portion of a correspond one of the protective spacers 250.

Referring to FIG. 12D, a low concentration impurity ion implantation process 262 may be performed using the offset spacers 260 as an ion implantation mask. When the gate structure 200 is a PMOS type transistor, P-type impurities may be implanted to form a P-type low concentration impurity region 300a in the substrate 110. When the gate structure 200 is an NMOS type transistor, N-type impurities may be implanted to form an N-type low concentration impurity region 300a in the substrate 110.

Referring to FIG. 12E, a spacer insulating layer 270a may be formed on the gate structure 200, on the offset spacers 260, and on the impurity regions 300a. The spacer insulting layer 270a may have an etch selectivity with respect to the offset spacer 260, and may be deposited using a CVD method. For example, when the offset spacer 260 includes a silicon nitride layer, the spacer insulating layer 270a may include a silicon oxide layer. Alternatively, the spacer insulating layer 270a may include a silicon nitride layer.

Referring to FIG. 12F, the spacer insulating layer 270a may be anisotropically etched to form gate spacers 270 on the offset spacers 260. The gate spacers 270 may have a height corresponding to a height of the gate structure 200. The gate spacers 270 may cover a partial portion of the impurity regions 300a.

Referring to FIG. 12G, a high concentration impurity ion implantation process 272 may be performed using the gate spacer 270 and the gate structure 200 as an ion implantation mask. Thereby, a high concentration impurity region 300b may be formed in an outer side of the low concentration impurity region 300a. For example, portions of the impurity regions 300a that are not under the gate spacers 270 may be converted into high contraction impurity regions 300b by the ion implantation process 272. The remaining portions of the impurity regions 300a, i.e., the regions under the gate spacers 270, may form the low concentration impurity regions 300a based on the ion implantation process 262. The low concentration impurity region 300a and the high concentration impurity region 300b may have the same conductivity type and may additionally have a lightly doped drain (LDD) or double doped drain (DDD) structure. Therefore, an impurity region 300 including the low concentration impurity region 300a and the high concentration impurity region 300b may be formed.

Referring to FIG. 12H, an interlayer insulating layer 120 covering the substrate 110, the gate structure 200, and the gate spacers 270 may be formed. The interlayer insulating layer 120 may include, e.g., a silicon oxide.

Referring to FIG. 12I, a hole mask pattern 122 may be formed on the interlayer insulating layer 120. The interlayer insulating layer 120 and a portion of the substrate 110 in which the impurity region 300 is formed may be etched using the hole mask pattern 122 as an etch mask. As a result, contact holes 402 penetrating the interlayer insulating layer 120 to extend into the impurity regions 300 may be formed. For example, the contact holes 402 may extend through a partial portion of the impurity regions 300, e.g., a partial portion of the high concentration impurity regions 300b. The etching process for forming the contact hole 402 may include a first process of etching the interlayer insulating layer 120, and a second process of etching a portion of the substrate 110. The first process may include a process of etching a silicon oxide, and the second process may include a process of etching silicon.

Referring to FIG. 12J, a hole insulating layer 130 may be formed along a profile of the contact holes 402 and an upper surface of the interlayer insulating layer 120. The hole insulating layer 130 may include, e.g., a silicon nitride (SiN) layer.

Referring to FIG. 12K, the hole insulating layer 130 may be anisotropically etched so that a sacrificial spacer 132 may be formed on a sidewall of the contact hole 402. The sacrificial spacers 132 may be formed so as to expose a bottom region of the contact hole 402, e.g., to expose a bottommost surface of the contact hole 402. For example, a central portion of the bottom of the contact hole 402 may be completely exposed through the sacrificial spacer 132 that surrounds the central portion.

Referring to FIG. 12L, a thermal oxidation process for the substrate 110 may be performed, e.g., on portions of the substrate 110 exposed through the contact hole 402 and the sacrificial spacers 132. For example, the impurity regions 300 exposed by the bottom region of the contact hole 402 may be selectively oxidized to form an insulating region 430. That is, the insulating region 430 may be formed under the contact hole 402. The insulating region 430 may have various shapes, e.g., according to the exemplary embodiments.

Referring to FIG. 12M, the sacrificial spacer 132 may be removed after forming the insulating region 430.

Referring to FIG. 12N, during the etching process for forming the contact hole 402, the impurity region 300 adjacent to the contact hole 402 may be damaged. For example, impurity concentration of the impurity region 300 may vary. Therefore, an ion implantation process 404 for implanting impurities into the impurity region 300 adjacent to the contact hole 402 may be performed to reduce and/or cure the damaged impurity region 300. Accordingly, an additional impurity region 310 may be formed within the impurity region 300. The additional impurity region 310 may be formed by implanting impurities having the same conductivity type as the impurity region 300. The impurities may be implanted into the impurity region 300 adjacent to the sidewall of the contact hole 402 using, e.g., a plasma doping (PLAD) process. Accordingly, the additional impurity region 310 may surround, e.g., completely surround, the portions of the contact hole 402 extending into the substrate 110.

Referring to FIG. 12O, a barrier layer 420 may be formed, e.g., conformally formed, on inner surfaces of the contact holes 402 and on the interlayer insulating layer 120. The barrier layer 420 may be formed of, e.g., titanium (Ti) and titanium nitride (TiN). The barrier layer 420 may be formed using, e.g., a physical vapor deposition (PVD) method, a nitrification reaction method, and/or a CVD method. The barrier layer 420 may reduce the possibility of and/or prevent a conductive material (for example, to be formed in a subsequent process) from diffusing into the silicon substrate 110.

Referring to FIG. 12P, a third conductive layer 410 may be formed on the barrier layer 420. The third conductive layer 410 may include a metal such as tungsten (W). The third conductive layer 410 may be deposited to fill the contact hole 402 using, e.g., a CVD method. Subsequently, barrier layer 420 and the third conductive layer 410 may be planarized until the interlayer insulating layer 120 is exposed so that a contact structure, e.g., as in FIG. 1A may be formed.

Figure 6:
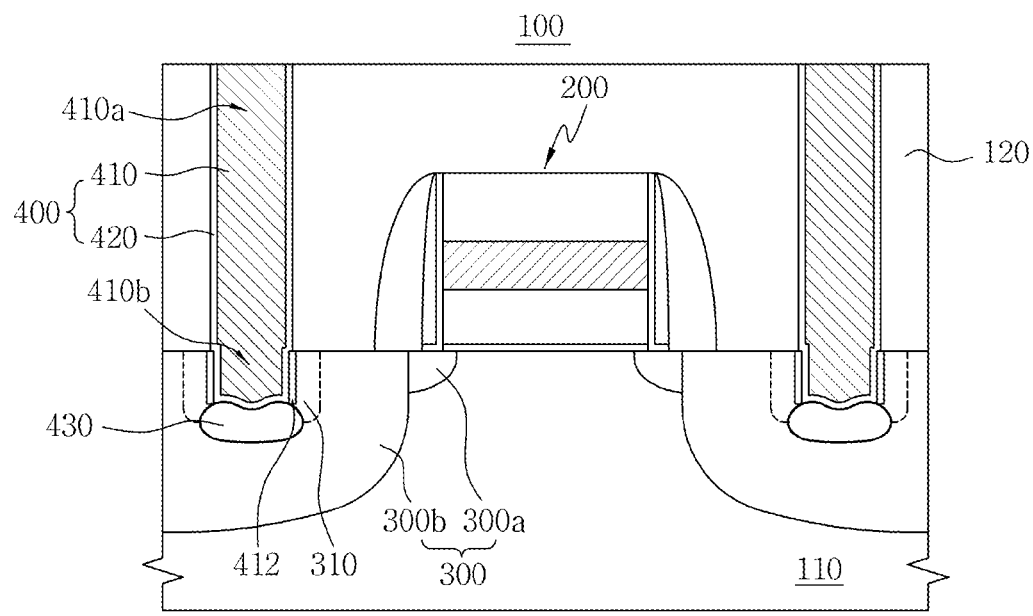
FIGS. 6 to 10 illustrate longitudinal cross-sectional views of semiconductor devices according to other exemplary embodiments.
Figure 12Q:
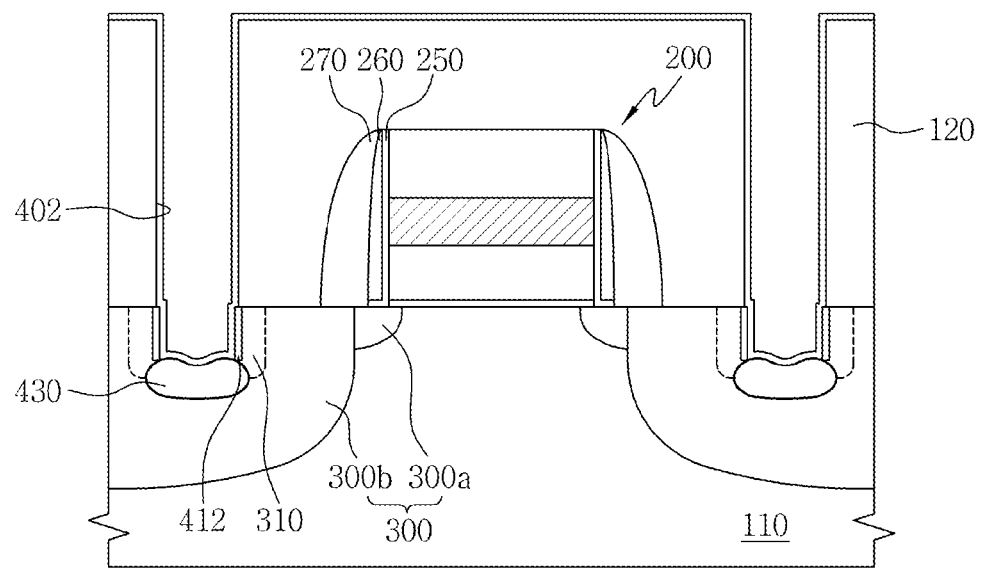

FIG. 12Q illustrates a cross-sectional view depicting a stage in a method of fabricating a semiconductor device of FIG. 6 that includes a metal silicide layer 412, according to another exemplary embodiment. According to an applied embodiment, as shown in FIG. 12Q, a method of fabricating a semiconductor device may further include forming a metal silicide layer 412 (for example, a cobalt silicide layer 412). The metal silicide layer may be formed after forming the additional impurity region 310 but before forming the barrier layer 420. The stage of may include deposition by performing a PLAD process for supplementing impurities and then depositing a cobalt layer as a metal layer. Any remaining cobalt layer not reacted may be removed through a cleaning process. The barrier layer 420 and the third conductive layer 410 may be deposited and planarized to complete the semiconductor device 100 of FIG. 6.

Second Exemplary Embodiment of Fabrication Method

FIGS. 13A to 13D illustrate cross-sectional views depicting stages in a method of fabricating a semiconductor device in FIG. 2A that includes the insulating region 530, according to another exemplary embodiment.

Figure 13A:
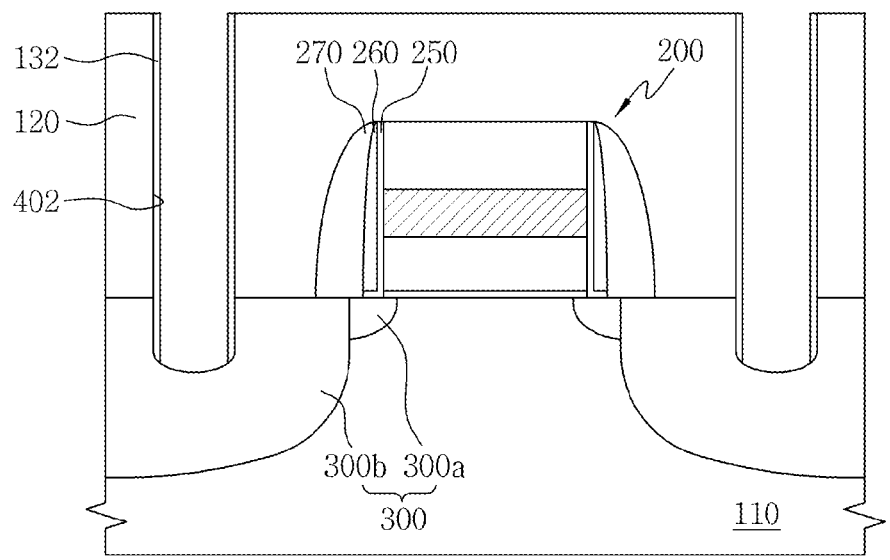
FIGS. 13A to 13D illustrate cross-sectional views depicting stages in a method of fabricating a semiconductor device according to another exemplary embodiment.
Figure 13B:
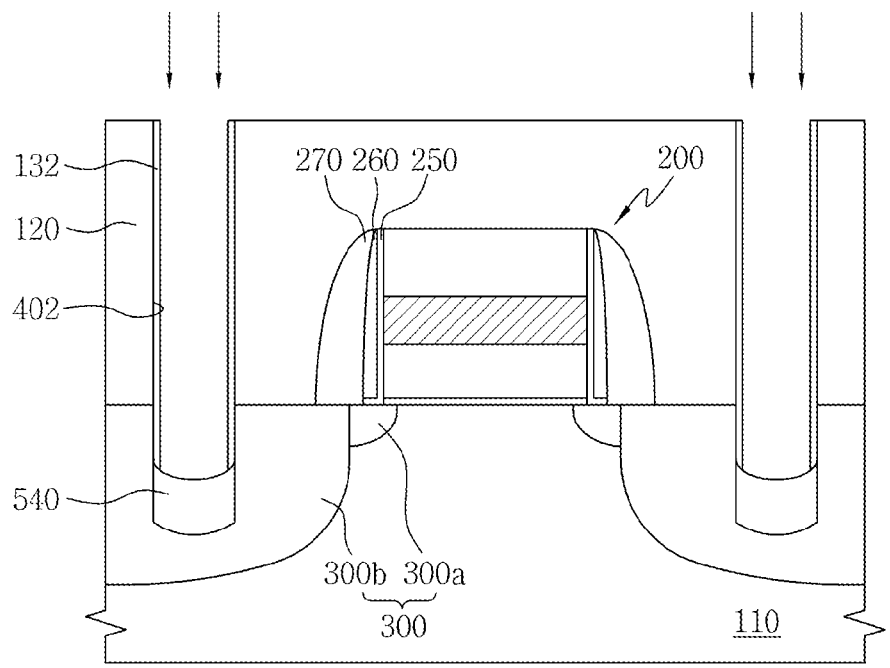

Referring to FIG. 13A, as shown in FIG. 12k, a substrate 110 in which a sacrificial spacer 132 is formed on a sidewall of a contact hole 402 may be prepared. Germanium may be implanted into the substrate 110 using an ion implantation process. Therefore, a silicon germanium (Si—Ge) region 540 doped with Ge may be formed within an impurity region 300 under the contact hole 402.

Figure 13C:
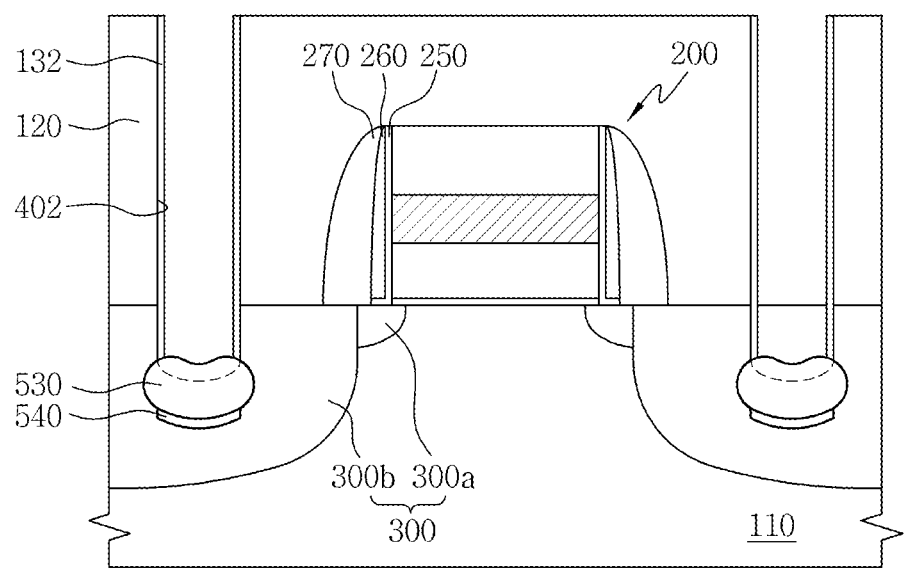

Referring to FIG. 13C, a thermal oxidation process for the substrate 110 having the silicon germanium region 540 may be performed to form an insulating region 530 under the contact hole 402. During the thermal oxidation process, the sidewall of the contact hole 402 may be protected by the sacrificial spacer 132.

In applied embodiments, the silicon germanium region 540 doped with Ge may remain under the insulating region 530. In another applied embodiment, using a thermal oxidation process for forming the insulating region 530, the silicon germanium region 540 may not remain.

Subsequently, the sacrificial spacer 132 may be removed. As shown in FIG. 12P, a conductive layer filling the contact hole 402 may be formed and planarized until an interlayer insulating layer 120 is exposed, thereby forming a contact structure.

Figure 7:
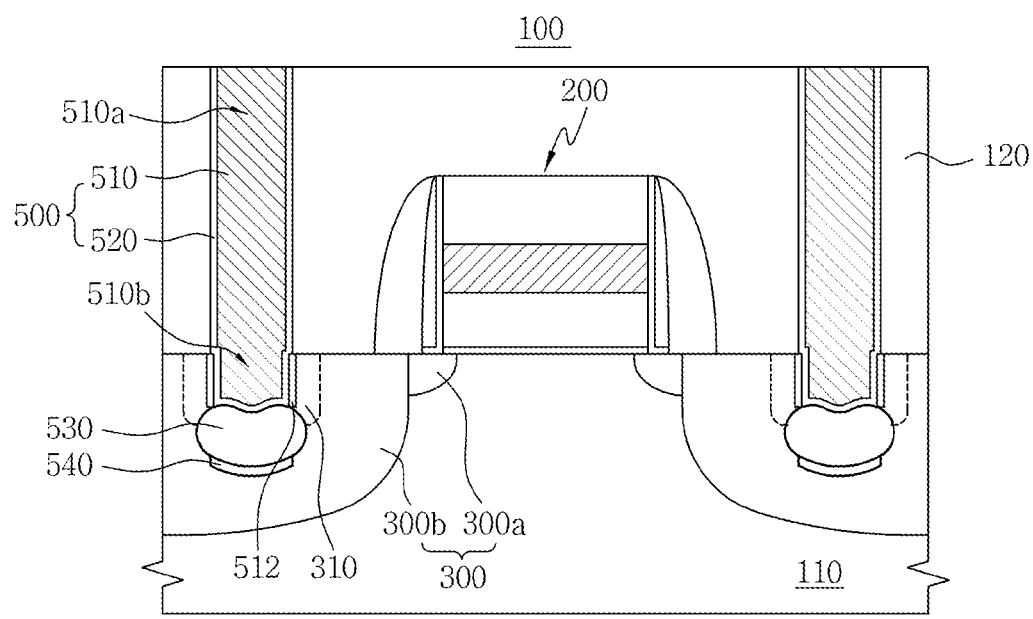
Figure 8:
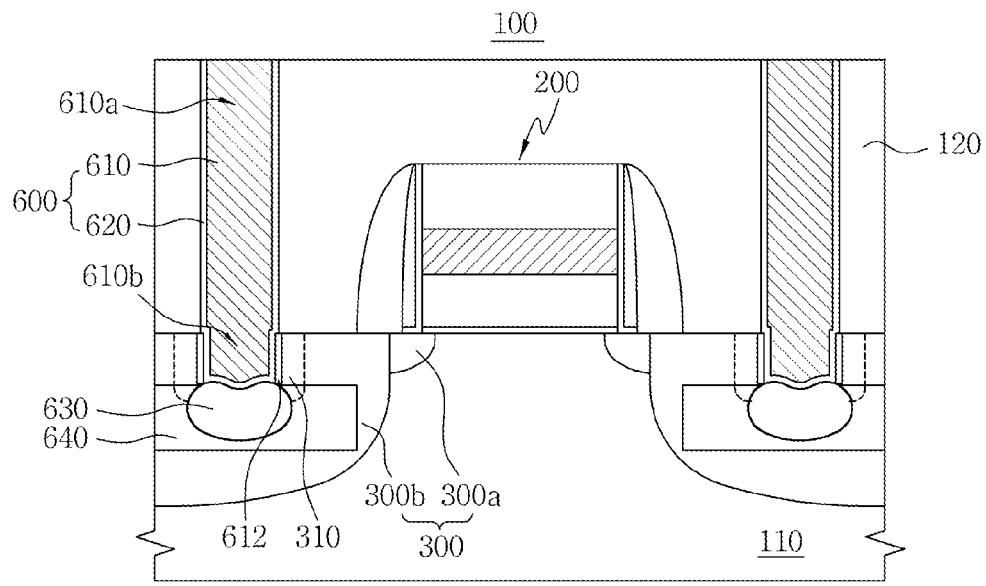
Figure 13D:
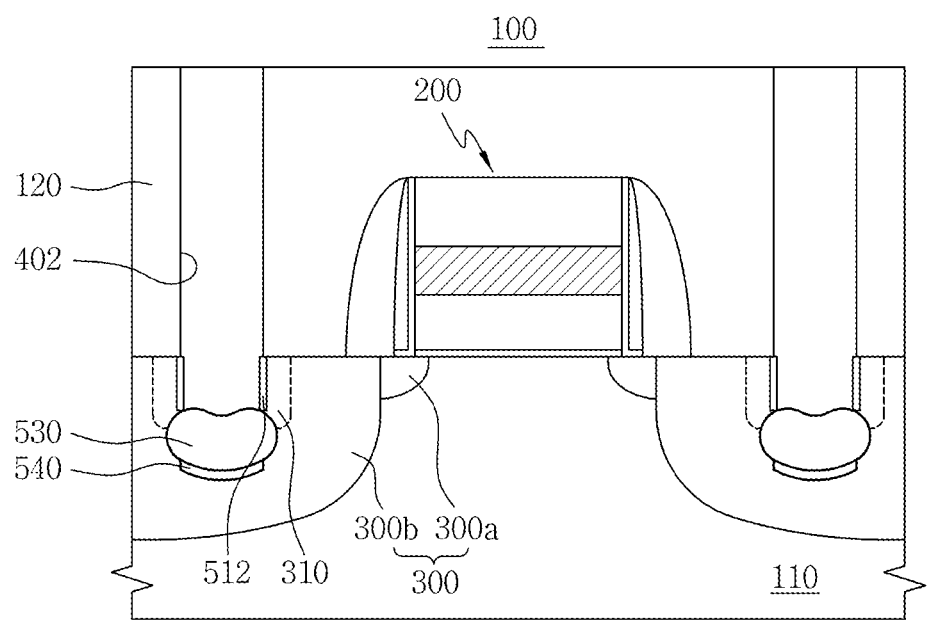

Alternatively, after the sacrificial spacer 132 is removed, as described in FIG. 13D, an additional impurity region 310 may be formed within the impurity region 300 adjacent to the sidewall of the contact hole 402, a metal silicide layer 512 may be formed on the sidewall of the contact hole 402, and a contact structure 500 filling the contact hole 402 may be formed so that the semiconductor device shown in FIG. 7 may be fabricated.

Third Exemplary Embodiment of Fabrication Method

FIGS. 14A to 14F illustrate cross-sectional views depicting stages in a method of fabricating a semiconductor device in FIG. 3A that includes the silicon germanium region 640, according to another exemplary embodiment.

Figure 14A:
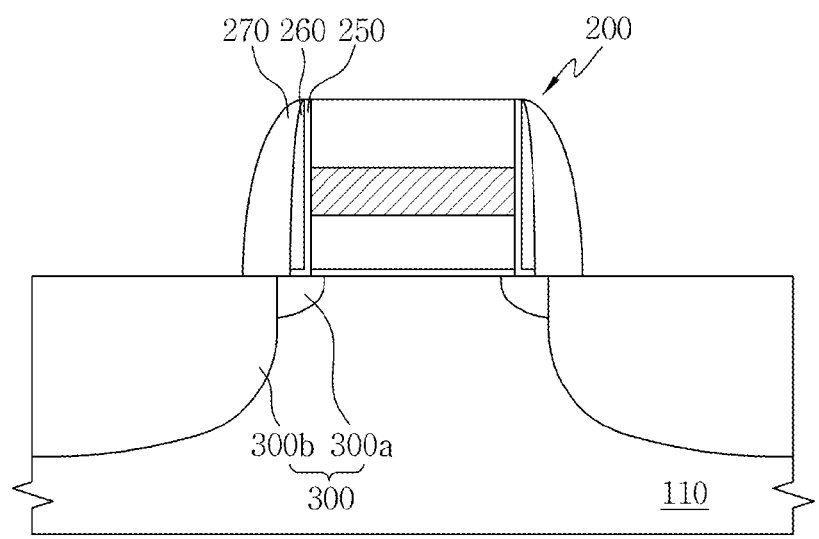
FIGS. 14A to 14F illustrate cross-sectional views depicting stages in a method of fabricating a semiconductor device according to another exemplary embodiment.

Referring to FIG. 14A, a substrate 110 in which a transistor is formed may be prepared. For example, the substrate 110 in which the transistor is formed, may be the substrate 110 as shown in FIG. 12G (which may be prepared using the stages depicted in FIGS. 12A to 12G)

Figure 14B:
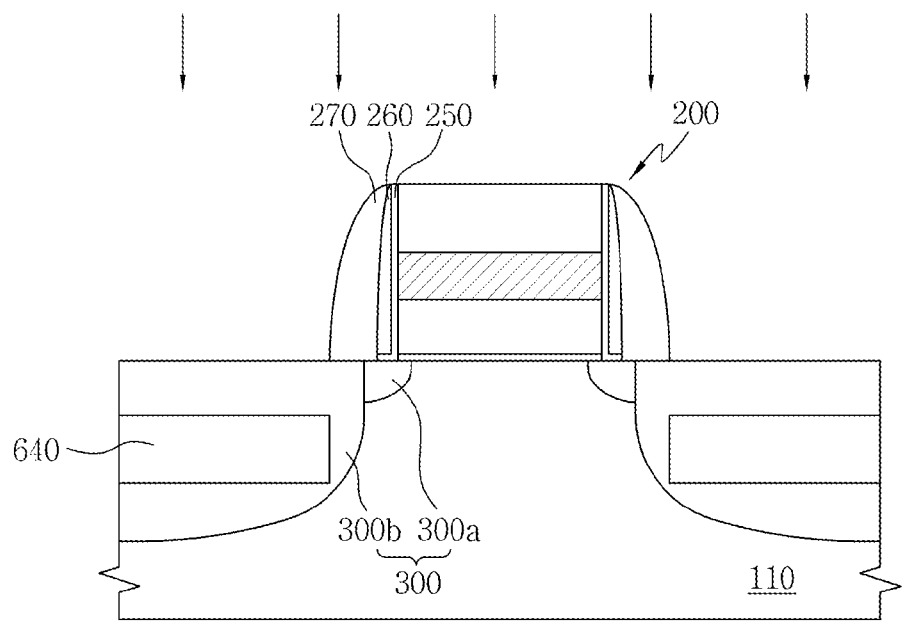

Referring to FIG. 14B, prior to forming the interlayer insulating layer 120, an ion implantation process may be performed using the gate structure 200 and the gate spacer 270 as an ion implantation mask to form the silicon germanium region (Si-GE) region 640 at opposing sides of the gate structure 200.

The silicon germanium region 640 may be formed in a predetermined depth from a surface of the substrate 110. For example, the silicon germanium region 640 may be formed within an impurity region 300, and a top and a bottom of the silicon germanium region 640 may be surrounded by the impurity region 300. The silicon germanium region 640 may be embedded within, e.g., completely within, the high concentration impurity region 300$b$. The predetermined depth of the silicon germanium region 640 may be greater than a depth of the low concentration impurity region 300$a$.

Figure 14C:
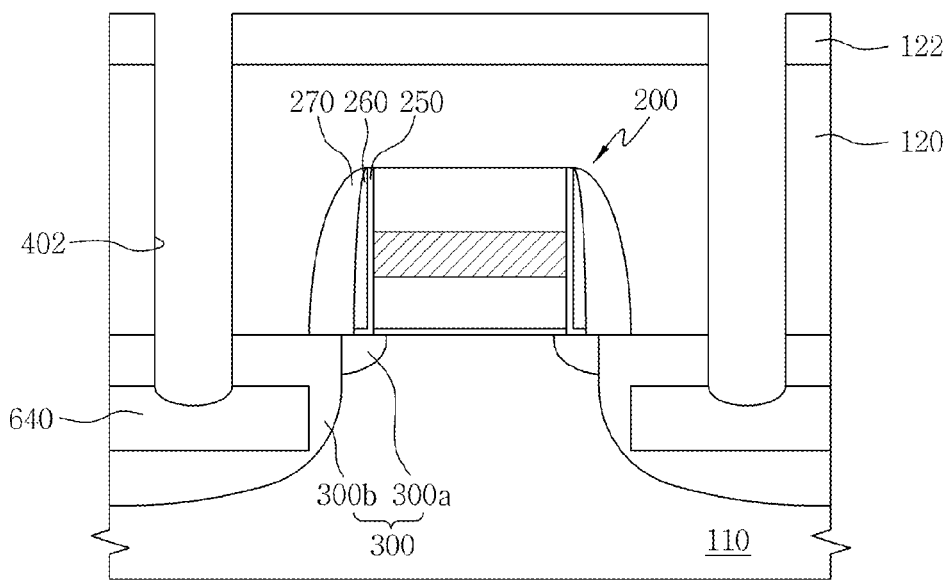

Referring to FIG. 14C, the interlayer insulating layer 120 may be formed on the substrate 110 in which the silicon germanium region 640 is already formed. A mask pattern 122 may be formed on the interlayer insulating layer 120. The interlayer insulating layer 120 and a portion of the impurity region 300 may be etched using the mask pattern 122 as an etch mask so that a contact hole 402 may be formed. The portion of the impurity region 300 may be etched so that the silicon germanium region 640 can be exposed by the contact hole 402. A portion of the silicon germanium region 640 may also be etched. Subsequently, the mask pattern 122 may be removed.

Figure 14D:
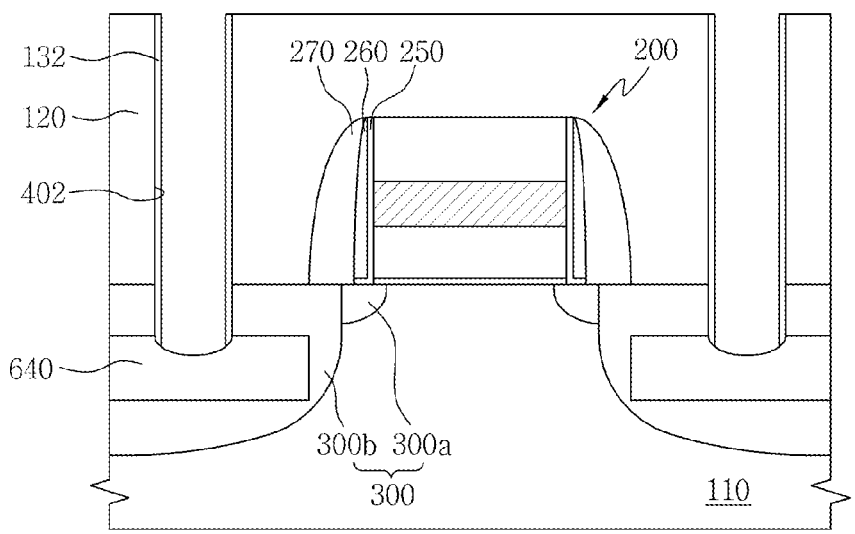

Referring to FIG. 14D, a sacrificial spacer 132 may be formed on a sidewall of the contact hole 402. The sacrificial spacer 132 may expose at least a portion of the silicon germanium region 640.

Figure 14E:
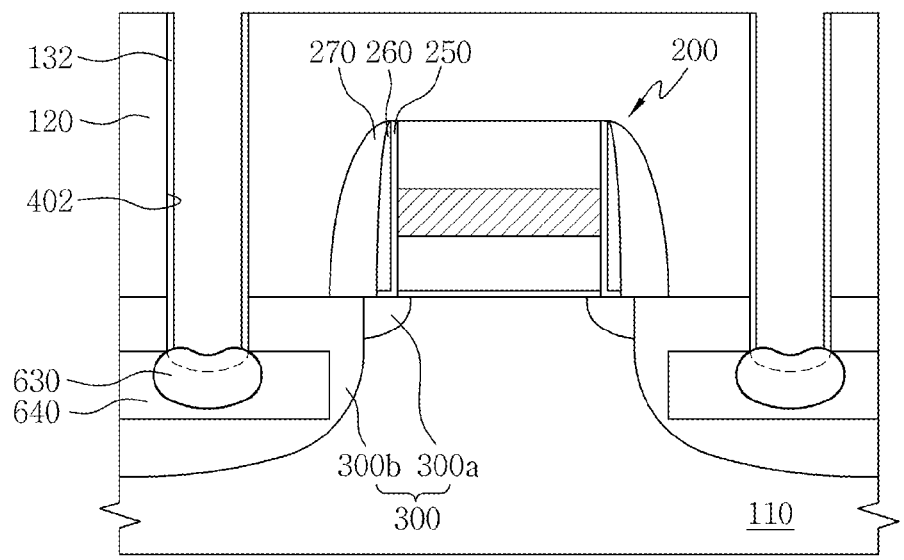

Referring to FIG. 14E, the silicon germanium region 640 exposed by the contact hole 402, e.g., through the sacrificial spacer 132, may be selectively oxidized to form an insulating layer region 630 that extends through at least a portion of the silicon germanium region 640. According to an exemplary embodiment, a portion of the silicon germanium region 640 may remain under the insulating layer region 630. According to another exemplary embodiment, the insulating layer region 630 may be formed to penetrate at least an upper portion of the silicon germanium region 640. Subsequently, the sacrificial spacer 132 may be removed, and a contact structure filling the contact hole 402 may be formed so that the semiconductor device described in FIG. 3A may be formed.

Figure 14F:
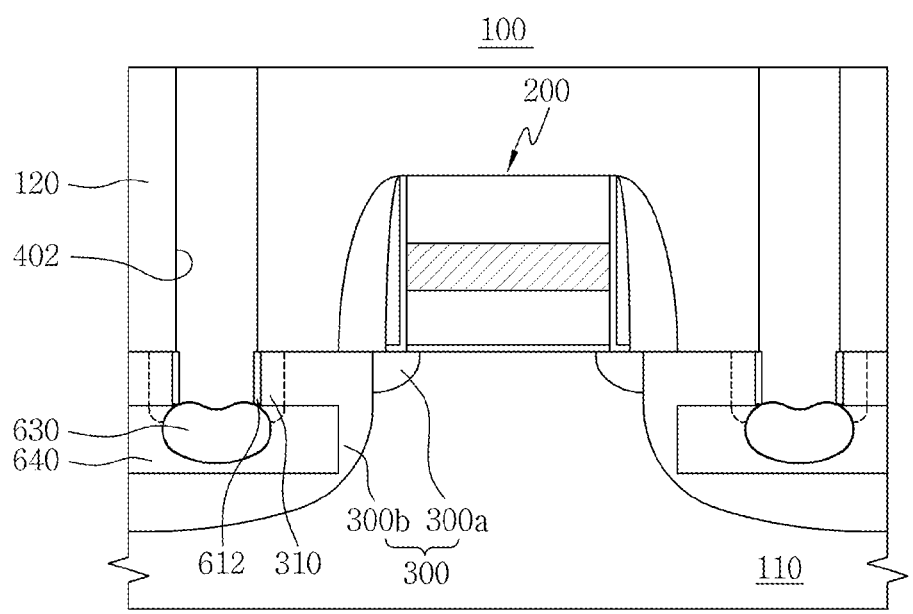

Alternatively, after the sacrificial spacer 132 is removed, as shown in FIG. 12N, the additional impurity region 310 may be formed within the impurity region 300 adjacent to the sidewall of the contact hole 402. Referring to FIG. 14F, a metal silicide layer 612 may be formed on the sidewall of the contact hole 402, and a contact structure 600 filling the contact hole 402 may be formed, so that the semiconductor device shown in FIG. 8 may be fabricated.

Fourth Exemplary Embodiment of Fabrication Method

FIGS. 15A to 15D illustrate cross-sectional views depicting stages in a method of fabricating a semiconductor device of FIG. 4 that includes the silicon germanium region 740, according to another exemplary embodiment.

Figure 15A:
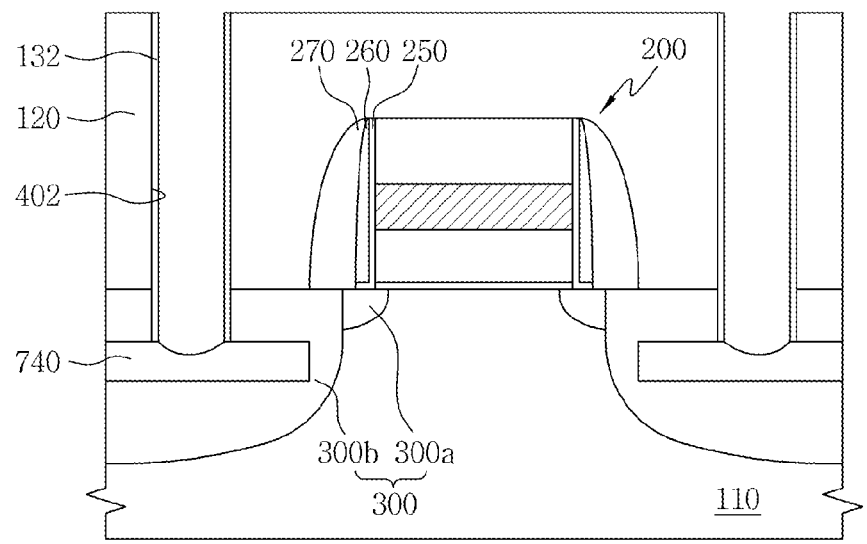
FIGS. 15A to 15D illustrate cross-sectional views depicting stages in a method of fabricating a semiconductor device according to another exemplary embodiment.

Referring to FIG. 15A, the silicon germanium regions 740 may be formed within a substrate 110 at opposing sides of the gate structure 200, e.g., as discussed with respect to FIGS. 14A to 14C. Subsequently, similar to FIGS. 14C and 14D, an interlayer insulating layer 120 may be formed on the substrate 110 having the silicon germanium regions 740. The interlayer insulating layer 120 and a portion of an impurity region 300 may be etched to form the contact hole 402, and the sacrificial spacer 132 may be formed on a sidewall of the contact hole 402. A bottom region of the contact hole 402 may expose the silicon germanium region 740.

Figure 15B:
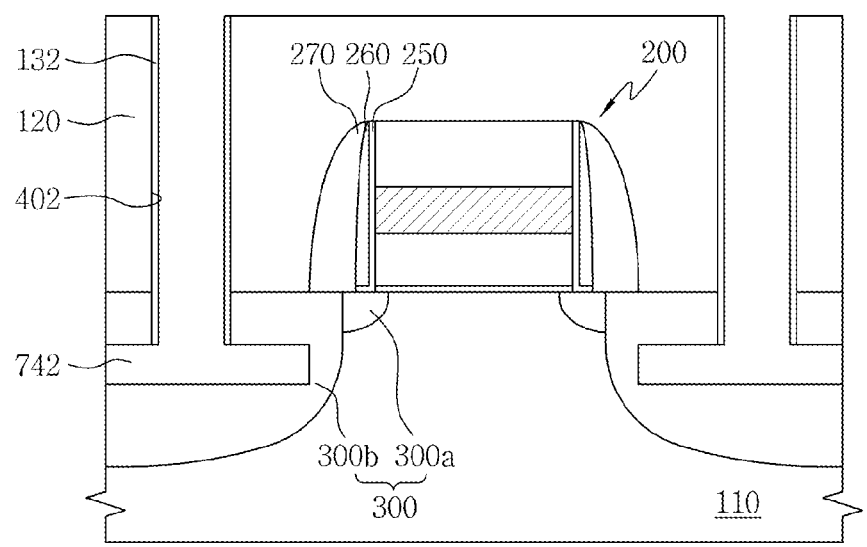

Referring to FIG. 15B, the silicon germanium region (740 of FIG. 15A) may be selectively removed to form a cavity 742. For example, substantially the entire silicon germanium region 740 may be removed to form a void.

Figure 15C:
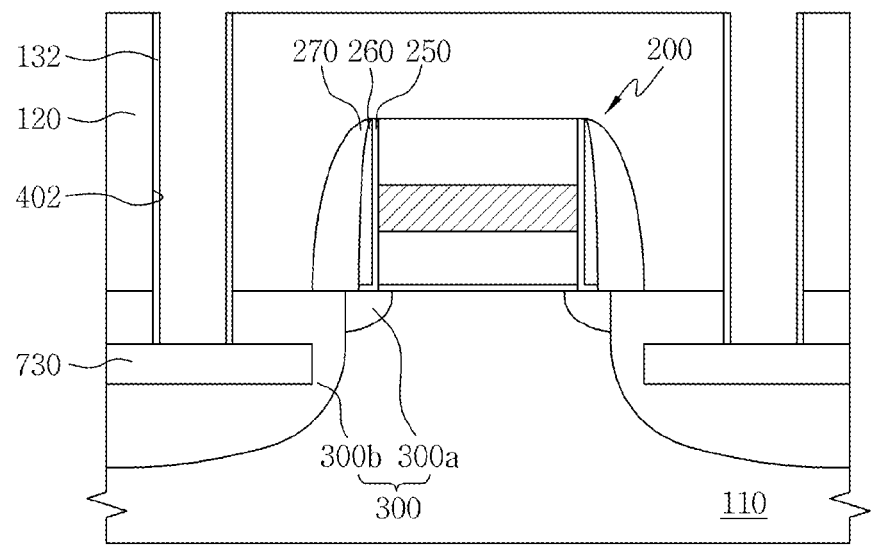

Referring to FIG. 15C, the insulating layer region 730 may be formed to fill the cavity 742, e.g., the insulating layer region 730 may be formed by a thermal oxidation process. A width of the insulating layer region 730 may be larger than that of the contact hole 402. Subsequently, the sacrificial spacer 132 may be removed, and a contact structure filling the contact hole 402 may be formed, thereby forming the semiconductor device 100 as shown in FIG. 4.

Figure 9:
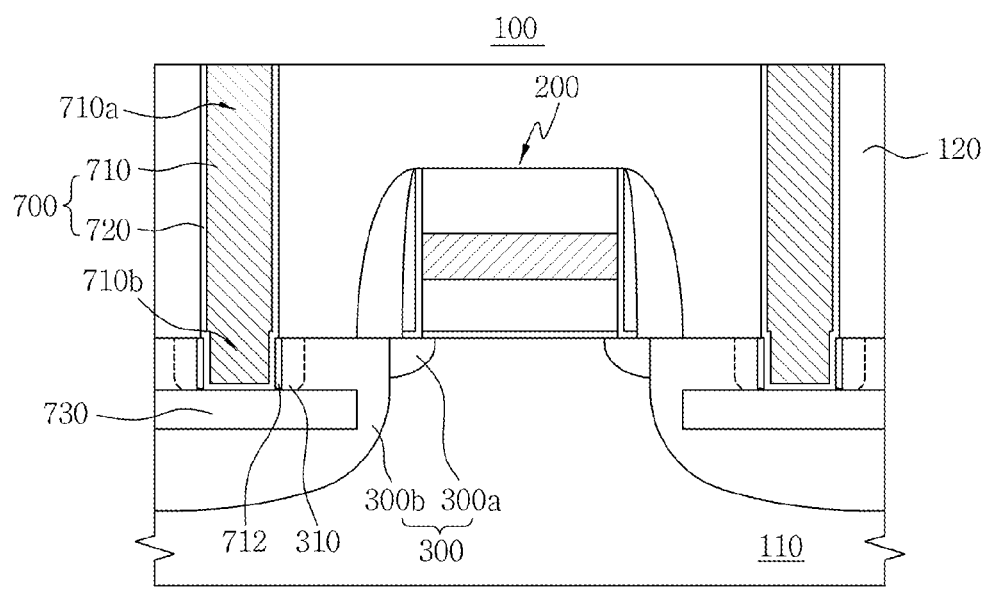
Figure 10:
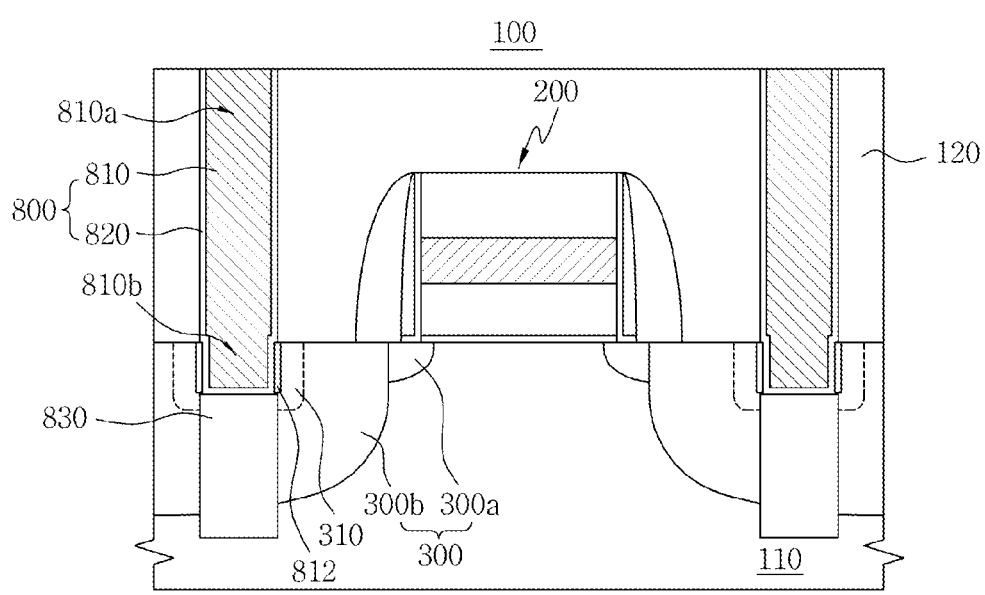
Figure 15D:
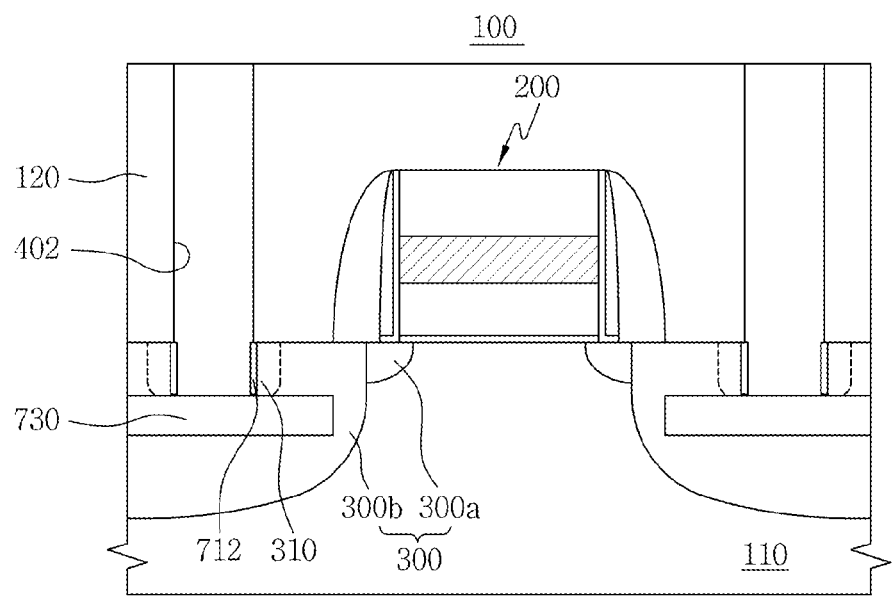

Alternatively, after the sacrificial spacer 132 is removed, as shown in FIG. 12N, an additional impurity region 310 may be formed within the impurity region 300 adjacent to the sidewall of the contact hole 402. Referring to FIG. 15D, the metal silicide layer 712 may be formed on the sidewall of the contact hole 402, and then the contact structure 700 filling the contact hole 402 may be formed, thereby forming the semiconductor device as shown in FIG. 9.

Figure 16A:
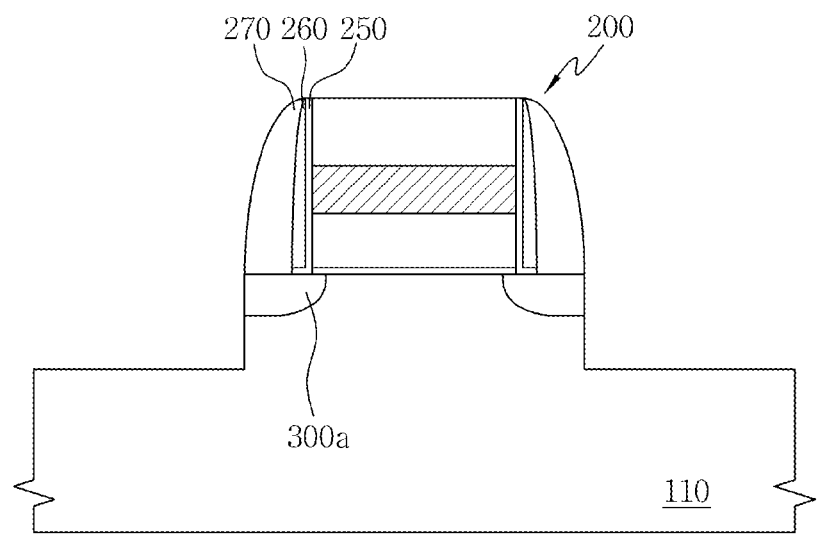
FIGS. 16A and 16B illustrate cross-sectional views depicting stages in a method of fabricating a semiconductor device according to another exemplary embodiment.
Figure 16B:
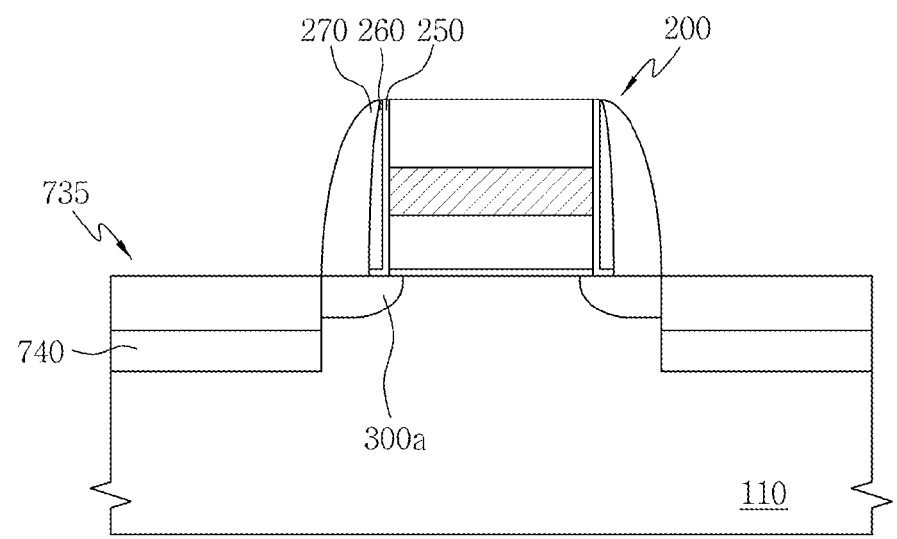

FIGS. 16A and 16B illustrate cross-sectional views depicting stages in a method of fabricating a semiconductor device of FIG. 4, according to another exemplary embodiment.

Referring to FIG. 16A, as shown in FIG. 12D, the substrate 110 including the gate structure 200 and the low concentration impurity region 300a may be provided. The substrate at opposing sides of the gate structure 200 may be etched to a predetermined depth, e.g., so that a lateral side of the low concentration impurity region 300a is exposed. The predetermined depth may be greater than a depth of the low concentration impurity region 300a in the substrate 110.

Referring to FIG. 16B, an epitaxial growth process may be performed to form single crystalline structures 735 including silicon germanium (Si—Ge) regions 740 on the substrate 110 at opposing sides of the gate structure 200. Subsequently, an impurity ion implantation process may be performed on the opposing sides of the gate structure 200. As a result, the substrate 110 as shown in FIG. 14B may be formed. In some embodiments, as shown in FIG. 14B, the silicon germanium region 740 may be formed by an ion implantation process. In another embodiment, as shown in FIG. 16B, the single crystalline structure 735 including the silicon germanium region 740 may be formed using an epitaxial growth process.

Fifth Exemplary Embodiment of Fabrication Process

FIGS. 17A to 17D illustrate cross-sectional views depicting stages in a method of fabricating a semiconductor substrate as shown in FIG. 5 that includes the insulating layer region 830, according to another exemplary embodiment.

Figure 17A:
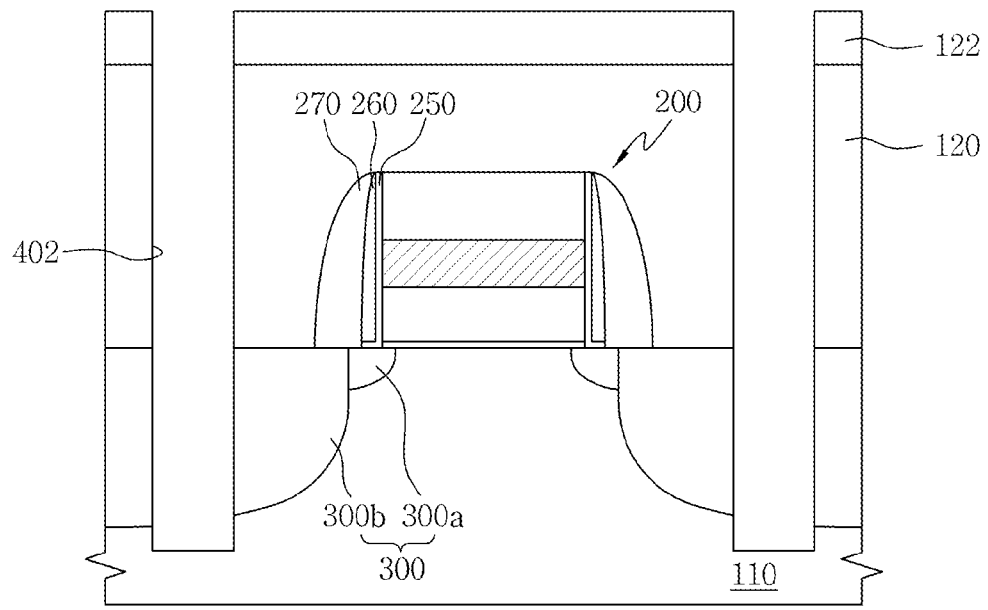
FIGS. 17A to 17D illustrate cross-sectional views depicting stages in a method of fabricating a semiconductor device according to another exemplary embodiment.

Referring to FIG. 17A, as shown in FIG. 12I, the interlayer insulating layer 120 may be formed to cover the substrate 110, and the mask pattern 122 may be formed on the interlayer insulating layer 120.

The interlayer insulating layer 120 and a portion of the substrate 110 may be etched using the mask pattern 122 as an etch mask to form a contact hole 402. The contact hole 402 may penetrate the interlayer insulating layer 120 and the impurity region 300, e.g., the high concentration impurity region 300b, to extend into a portion of the substrate 110 under the impurity region 300. For example, the contact hole 402 may expose the substrate 100 under a junction of the impurity region 300.

Figure 17B:
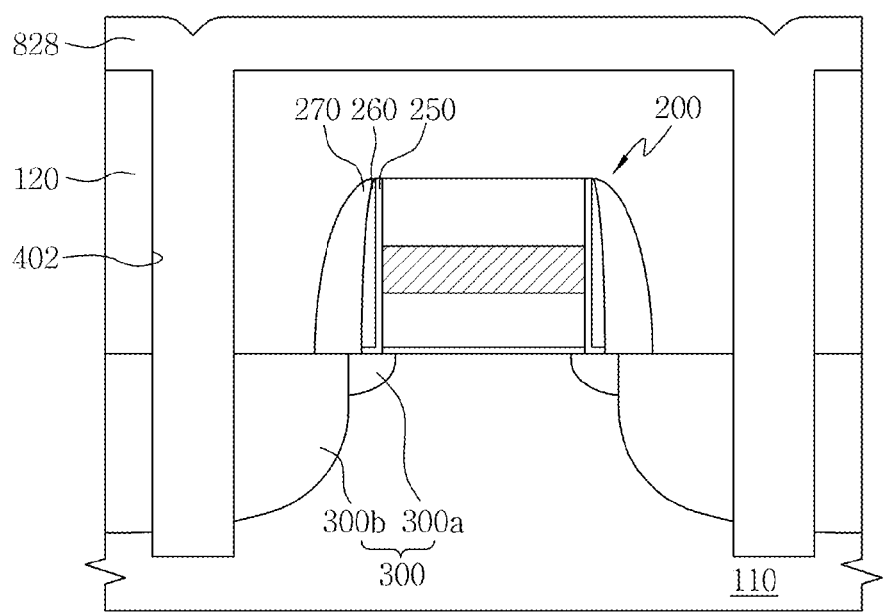

Referring to FIG. 17B, a silicon oxide layer 828 filling the contact hole 402 may be formed on the substrate 110.

Figure 17C:
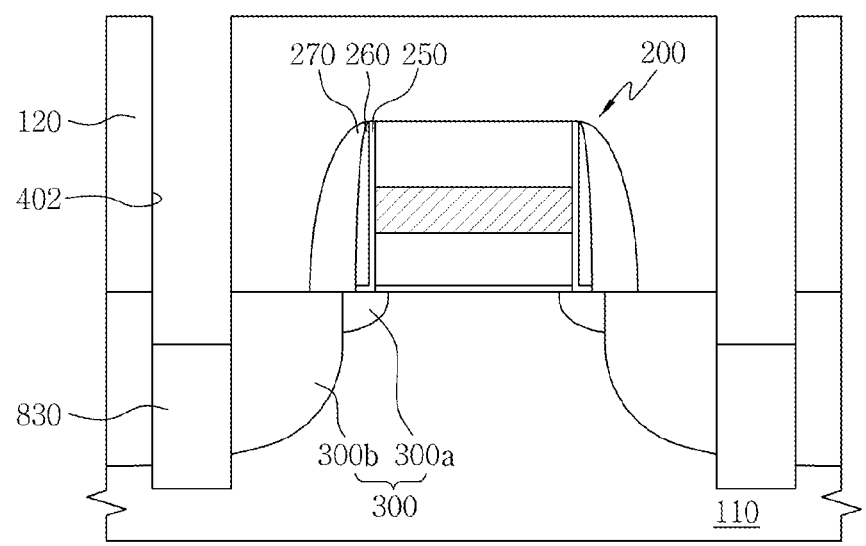

Referring to FIG. 17C, a portion of the silicon oxide layer 828 may be etched using an etch-back process to form an insulating layer region 830 remaining in a portion of the contact hole 402 that extends through the substrate 110. For example, an upper surface of the insulating layer region 830 may be positioned at a higher level than the junction of the impurity region 300, and positioned at a lower level than an upper surface of the impurity region 300.

Figure 17D:
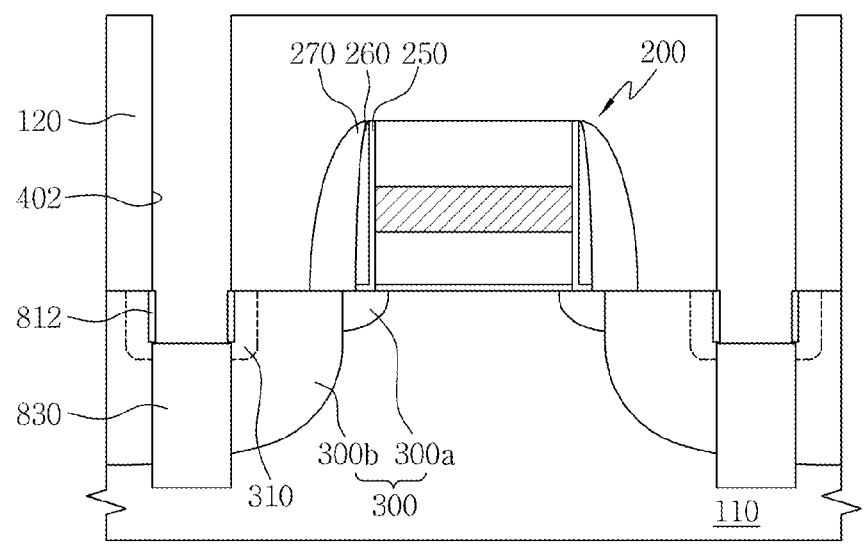

Subsequently, a contact structure filling a remaining portion of the contact hole 402 may be formed. Referring to FIG. 17D, an additional impurity region 310 may be formed within the impurity region 300 adjacent to a sidewall of the contact hole 402, the metal silicide layer 812 may be formed on the sidewall of the contact hole 402, and the contact structure filling the contact hole 402 may be formed, e.g., in that order.

Figure 18:
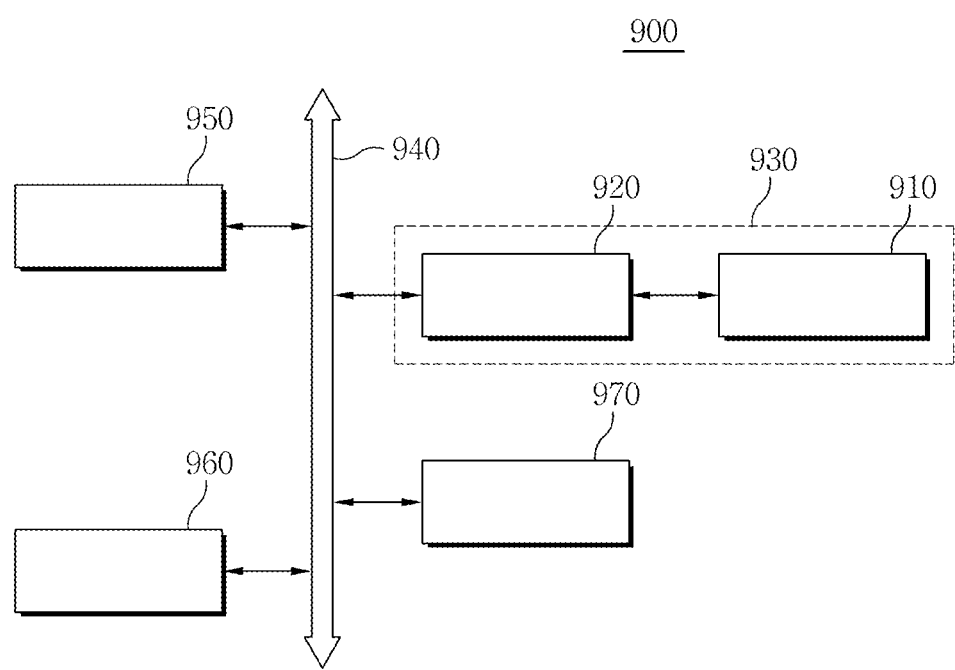
FIG. 18 illustrates a block diagram of an exemplary electronic system as an applied example of a semiconductor device according to exemplary embodiments.

FIG. 18 illustrates a block diagram of an exemplary electronic system as an applied example of a semiconductor device according to exemplary embodiments.

Referring to FIG. 18, a memory system 900 may include a semiconductor memory device 930 that includes a variable resistance memory device 910 and a memory controller 920. The memory system 900 may include a central processing unit (CPU) 950 electrically connected to a system bus 940, a user interface (UI) 960, and a power supply device 970. The variable resistance memory device 910 and the memory controller 920 may include at least one semiconductor device according to exemplary embodiments.

Data provided through the UI 960 or processed by the CPU 950 may be stored in the variable resistance memory device 910 through the memory controller 920. The variable resistance memory device 910 may include a solid state disc (SSD) and in this case, the writing speed of the memory system 900 may be dramatically fast. Not shown in drawings, as is obvious to those skilled in the art, the memory system 900 may further include, e.g., at least one of an application chipset, a camera image processor (CIS), a mobile dynamic random access memory (DRAM), and the like. The memory system 900 may be applied to a personal digital assistant (PDA), a portable computer, a web tablet, a wireless phone, a mobile phone, a digital music player, a memory card, or devices which may transmit/receive information in a wireless environment.

The variable resistance memory device 910 or the memory system 900 may be mounted in various package types. For example, the variable resistance memory device 910 or the memory system 900 may be packaged and mounted in a manner such as a package on package (POP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a system in package (SIP), a multi chip package (MCP), a wafer-level fabricated package (WFP), a wafer-level processed stack package (WSP), or the like.

Further, an element not having a reference numeral or having only the reference numeral in a figure may easily be understood as a name or a function through illustration of other figures.

By way of summation and review, a contact process may include forming an interlayer insulating layer on a semiconductor substrate having a transistor, forming a contact hole penetrating the interlayer insulating layer, exposing a source/drain region of the transistor using, e.g., a photo and dry etching process, and forming a conductive plug within the contact hole. As the size of a semiconductor device is increasingly scaled down, the width or plane area of the contact hole becomes smaller so that contact area between the source/drain region and the conductive plug decreases; and thus, a contact resistance between the source/drain region and the conductive plug may increase. However, performance of the transistor may be remarkably degraded by the increase in contact resistance.

The exemplary embodiments discussed above relate to a structure and a method capable of reducing contact resistance by increasing the contact area between a source/drain region and a conductive plug even though the width or planar area of a contact hole is reduced.

Further, when the source/drain region has a shallow junction, a leakage current may be generated. Accordingly, exemplary embodiments may relate to a method of forming an oxide layer under a bottom of the conductive plug.

According to exemplary embodiments, the height of a contact structure buried within an impurity region may be be adjusted to improve contact resistance. Further, an insulating layer may be formed between a bottom of the contact structure and the impurity region to improve a leakage current.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a gate structure on a semiconductor substrate;
    an impurity region at a side of the gate structure, the impurity region being within the semiconductor substrate;
    an interlayer insulating layer covering the gate structure and the impurity region;
    a contact structure extending through the interlayer insulating layer and connected to the impurity region, the contact structure including a first contact structure having a side surface surrounded by the interlayer insulating layer, and a second contact structure penetrating into the impurity region and having a side surface surrounded by the impurity region; and
    an insulating region in the impurity region under the second contact structure, wherein the impurity region is a source or drain region that surrounds side surfaces and a bottom surface of the insulating region.

2. The semiconductor device as claimed in claim 1, wherein a width of the insulating region is greater than a width of the contact structure.

3. The semiconductor device as claimed in claim 1, wherein the insulating region extends through the impurity region.

4. The semiconductor device as claimed in claim 1, wherein the insulating region includes a silicon oxide.

5. The semiconductor device as claimed in claim 1, wherein the insulating region includes a silicon germanium oxide.

6. The semiconductor device as claimed in claim 1, wherein a height of the second contact structure is greater than a quarter of a width of the second contact structure.

7. The semiconductor device as claimed in claim 1, further comprising a silicon germanium region under the insulating region.

8. The semiconductor device as claimed in claim 7, wherein the silicon germanium region surrounds a bottom and a side surface of the insulating region.

9. The semiconductor device as claimed in claim 1, wherein the second contact structure includes a barrier layer on a sidewall thereof and includes a contact plug on the barrier layer.

10. The semiconductor device as claimed in claim 1, further comprising
    a metal silicide layer surrounding a sidewall of the second contact structure.

11. A semiconductor device, comprising:
    an impurity region;
    an insulating layer on the impurity region;
    a conductor extending into the impurity region through the insulating layer; and
    an insulating region arranged within the impurity region, the insulating region on a lower end portion of the conductor that extends into the impurity region, wherein the impurity region is a source or drain region that surrounds side surfaces and a bottom surface of the insulating region.

12. The semiconductor device as claimed in claim 11, wherein the impurity region includes a doped silicon and the insulating region includes a silicon oxide.

13. The semiconductor device as claimed in claim 11, wherein the conductor includes:
    a first conductor penetrating the insulating layer, and
    a second conductor extending into the impurity region, a length of the second conductor extending into the impurity region is larger than a quarter of a width of the second conductor.

14. The semiconductor device as claimed in claim 13, further comprising
    a barrier layer on a sidewall and a bottom surface of the second conductor.

15. The semiconductor device as claimed in claim 13, further comprising
    a metal silicide layer surrounding a sidewall of the second conductor.

16. A semiconductor device, comprising:
    a gate structure on an upper surface of a semiconductor substrate;
    an impurity region adjacent to the gate structure, the impurity region being within the semiconductor substrate;
    an interlayer layer covering the gate structure and the impurity region;
    a contact structure including a first portion extending through the interlayer layer and a second portion extending within the impurity region; and
    an insulating region within the impurity region, the insulating region being between a lower surface of the semiconductor substrate and a lower surface of the second portion of the contact structure, wherein the impurity region is a source or drain region that surrounds side surfaces and a bottom surface of the insulating region.

17. The semiconductor device as claimed in claim 16, wherein the insulating region is in direct contact with the lower surface of the second portion of the contact structure.

18. The semiconductor device as claimed in claim 17, wherein:
    a height of the second portion of the contact structure is greater than a quarter of a width of the contact structure,
    the second portion of the contact structure is entirely within the impurity region, and
    the first portion of the contact structure is above the impurity region.

19. The semiconductor device as claimed in claim 18, wherein:
    a width of the insulating region is greater than the width of the contact structure, and
    the insulating region is entirely within the impurity region.

20. The semiconductor device as claimed in claim 16, wherein:
    the interlayer layer is directly on the impurity region,
    a height of the contact structure is greater than a height of the interlayer layer, and
    along a width of the contact structure, the insulating region separates at least a portion of the lower surface of the second portion of the contact structure from the impurity region.

21. The semiconductor device as claimed in claim 1, wherein the impurity region surrounds all side surfaces and the bottom surface of the insulating region.

* * * * *